United States Patent
Ishikawa et al.

(10) Patent No.: US 6,821,644 B2
(45) Date of Patent: Nov. 23, 2004

(54) ORGANIC ELECTROLUMINESCENT DEVICE

(75) Inventors: Hitoshi Ishikawa, Tokyo (JP); Satoru Toguchi, Tokyo (JP); Hiroshi Tada, Tokyo (JP); Yukiko Morioka, Tokyo (JP); Atsushi Oda, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/729,195

(22) Filed: Dec. 5, 2000

(65) Prior Publication Data

US 2001/0012571 A1 Aug. 9, 2001

(30) Foreign Application Priority Data

Dec. 15, 1999 (JP) .............................. 11-356685
Dec. 15, 1999 (JP) .......................... 11-356686
Nov. 10, 2000 (JP) ........................ 2000-343560
Nov. 10, 2000 (JP) ........................ 2000-343561

(51) Int. Cl.$^7$ ............................................. H05B 33/12
(52) U.S. Cl. ........................ 428/690; 428/917; 313/504; 313/506
(58) Field of Search ................................ 428/690, 704, 428/917; 313/504, 506

(56) References Cited

FOREIGN PATENT DOCUMENTS

| | | |
|---|---|---|
| JP | 3-200889 | 9/1991 |
| JP | 4-178487 | 6/1992 |
| JP | H4-290851 A | 10/1992 |
| JP | 7-138561 | 5/1995 |
| JP | 8-12969 A | 1/1996 |
| JP | 8-20771 | 1/1996 |
| JP | 8-40995 | 2/1996 |
| JP | 8-40997 | 2/1996 |
| JP | 8-87122 | 4/1996 |
| JP | H8-109373 A | 4/1996 |
| JP | 8-239655 | 9/1996 |
| JP | 2686418 B2 | 8/1997 |
| JP | 9-268284 A * | 10/1997 |
| JP | 11-35532 | 2/1999 |
| JP | 11-74079 | 3/1999 |
| JP | 11-111460 A | 4/1999 |
| JP | 2924810 B2 | 5/1999 |
| JP | 11-185961 | 7/1999 |
| JP | 11-297473 | 10/1999 |
| JP | 2000-16973 A | 1/2000 |
| JP | 2001-131541 A | 5/2001 |
| KP | 1999-0078128 | 10/1999 |

OTHER PUBLICATIONS

English language translation of JP 9–268284 A (Oct. 1997).*

* cited by examiner

Primary Examiner—Marie Yamnitzky
(74) Attorney, Agent, or Firm—McGuireWoods LLP

(57) ABSTRACT

A specific bis(diarylamino)arylene compound expressed in the following general formula [1.1] is used as a constituent material of an organic EL device. By this, luminescent brilliance and EL property are improved, and further, reduction in luminescent property is suppressed, and durability is improved.

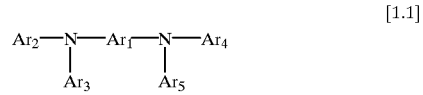

[1.1]

(wherein, $Ar_1$ represents a substituted or unsubstituted arylene group having 5 to 42 carbon atoms: at least one of $Ar_2$ to $Ar_3$ independently represents a group expressed in the following general formula [1.2]; and the remaining group(s) of $Ar_2$ to $Ar_5$ independently represents an aryl group having 6 to 20 carbon atoms, and at least one of $Ar_2$ to $Ar_5$ has at least one hydrocarbon group which may include oxygen atom(s).)

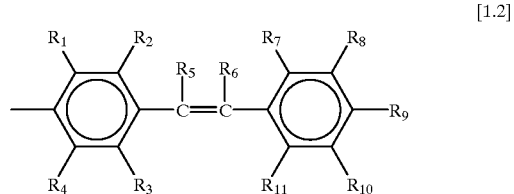

[1.2]

(wherein, each of $R_1$ to $R_{11}$ independently represents a hydrogen atom or a substituent.)

9 Claims, 1 Drawing Sheet

ORGANIC ELECTROLUMINESCENT DEVICE

BACKGROUND OF THE INVENTION

The present invention relates to an organic electroluminescent device having an excellent luminance property such as high luminance efficiency.

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, Vol. 51, 913 (1987) and the like), studies on an organic EL device have been briskly carried out. Tang et al. reported an organic EL device using tris(8-hydroxyquinolinol aluminum) in a light-emitting layer and a triphenyldiamine derivative in a hole-transporting layer. This stacked structure gives such advantages as an improvement in the injection efficiency of holes into the light-emitting layer; and confinement of the excitons into the light-emitting layer.

A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole transporting material, triphenyl amine derivatives and aromatic diamine derivatives such as 4,4'4,4"-tris(3-methylphenylphenylamino)-triphenyl amine which is a star burst molecule and N,N'-diphenyl-N,N'-bis(3-methylphenyl)-[1,1'-biphenyl]-4,4'-diamine are well known (for example, Patent Publications JP-A-8-20771, JP-A-8-40995, JP-A-8-40997, JP-A-8-53397, and JP-A-8-87122). As an electron transporting material, oxadiazole derivatives, triazole derivatives and the like are well known.

Chelate complexes such as tris(8-quinolinolate)aluminum complex, coumarin derivatives, tetraphenylbutadiene derivatives, bis-styrylarylene derivatives, oxadiazole derivatives and the like are known as light emitting materials. Since various color lights in a visible region from blue to red are obtained from these light-emitting materials, there is increased expectation for industrialization of a full color organic EL device (refer to, e.g., JP-A-8-239655, JP-A-7-138561, and JP-A-3-200889).

Further, in addition to the above-mentioned compounds, diphenylaminoarylene having a styryl group has been discloses as a useful constituent material of an organic electroluminescent device having high ability (JP-A Nos. 11-74079, 11-185961 and the like).

However, some EL devices containing the diphenylaminoarylene compound show that the luminance decrease because of the concentration quenching caused by the intermolecular interactions.

Further, the chemical stability of a distyryldiarylaminoarylene would decrease when both of two aryl groups in the diarylamino group comprise a styryl group at the same time, so the luminescent properties, especially the durability of EL devices containing the distyryldiarylaminoarylene compound decrease.

SUMMARY OF THE INVENTION

It is therefore an object of the present invention to provide materials for the organic EL devices having excellent luminescent properties.

A first aspect of the present invention for attaining this object is an organic electroluminescent device comprising one or more organic thin film layer(s) placed between an anode and a cathode, at least one of said layer being a luminescent layer, characterized in that said luminescent layer comprises a compound expressed in the following general formula [1.1] in the form of a single substance or a mixture containing the same.

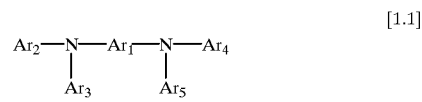

[1.1]

(wherein, $Ar_1$ represents a substituted or unsubstituted arylene group having 5 to 42 carbon atoms; at least one of $Ar_2$ to $Ar_5$ independently represents a group expressed in the following general formula [1.2]; the remaining group(s) of $Ar_2$ to $Ar_5$ independently represents an aryl group having 6 to 20 carbon atoms; and at least one of $Ar_2$ to $Ar_5$ comprises at least one hydrocarbon group which may include oxygen atom(s). $Ar_2$ and $Ar_3$ and/or $Ar_4$ and $Ar_5$ may mutually bond to form a ring.)

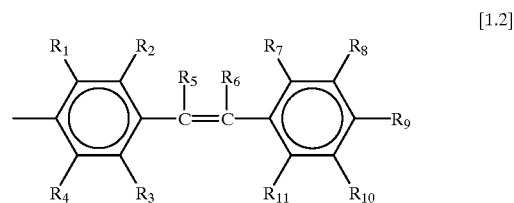

[1.2]

(wherein, each of $R_1$ to $R_{11}$ independently represents a hydrogen atom, halogen atom, hydroxyl group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group. Two of $R_1$ to $R_{11}$ may form a ring.)

A second aspect of the present invention is an organic electroluminescent device comprising one or more organic thin film layer(s) placed between an anode and a cathode, at least one of said layer being a luminescent layer, characterized in that said luminescent layer comprises a compound expressed in the following general formula [2.1] in the form of a single substance or a mixture containing the same.

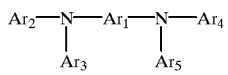

[2.1]

(wherein, $Ar_1$ represents a substituted or unsubstituted arylene group having 5 to 42 carbon atoms; at least one of $Ar_1$ to $Ar_5$ independently represents a group expressed in the following general formula [2.2]; the remaining group(s) of $Ar_2$ to $Ar_5$ independently represents an aryl group having 6 to 20 carbon atoms; and at least one of $Ar_2$ to $Ar_5$ comprises at least one saturated hydrocarbon group having 2 or more carbon atoms in which oxygen atom(s) may be inserted. $Ar_2$ and $Ar_3$ and/or $Ar_4$ and $Ar_5$ may mutually bond to form a ring.)

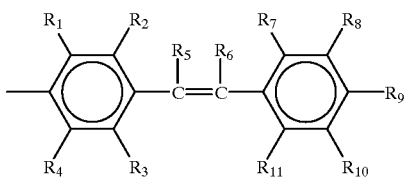

[2.2]

(wherein, each of $R_1$ to $R_{11}$ independently represents a hydrogen atom, halogen atom, hydroxyl group, substituted or unsubstituted amino group, cyano group, nitro group, substituted or unsubstituted alkyl group, substituted or unsubstituted alkenyl group substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group. Two of $R_1$ to $R_{11}$ may form a ring.)

There is also provided an organic electroluminescent device comprising at least an anode, a luminescent zone and a cathode, the luminescent zone being formed from one or more organic thin film layer(s), characterized in that the above-mentioned luminescent zone is adjacent to the anode, and a layer adjacent to the anode of the organic thin film layer(s) forming the luminescent zone contains a compound expressed in the above-described general formula [2.1] in the form of a single substance or a mixture containing the same.

A third aspect of the present invention is an organic electroluminescent device comprising one or more organic thin film layer(s) placed between an anode and a cathode, at least one of said layer being a luminescent layer, characterized in that said luminescent layer comprises a compound expressed in the following general formula [3.1] in the form of a single substance or a mixture containing the same.

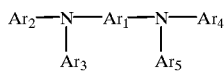

[3.1]

(wherein, $Ar_1$ represents a substituted or unsubstituted arylene group having 5 to 42 carbon atoms; each of $Ar_2$ and $Ar_3$ independently represents a group expressed in the following general formula [3.2]; and each of $Ar_4$ and $Ar_5$ independently represents substituted or unsubstituted aryl group having 6 to 20 carbon atoms. $Ar_2$ and $Ar_3$ and/or $Ar_4$ and $Ar_5$ may mutually bond to form a ring.)

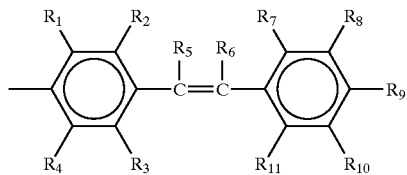

[3.2]

(wherein, each of $R_1$ to $R_{11}$ independently represents a hydrogen atom, halogen atom, hydroxyl group, substituted or unsubstituted amino group, cyano group, nitro group, substituted or unsubstituted alkyl group, substituted or unsubstituted alkenyl group, substituted or unsubstituted cycloalkyl-group, substituted or unsubstituted alkoxy group substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group; and $R_6$ is a substituent other than a hydrogen atom. Two of $R_1$ to $R_{11}$ may form a ring.)

There is also provided an organic electroluminescent device comprising at least an anode, a luminescent zone and a cathode, the luminescent zone being formed from one or more organic thin film layer(s), characterized in that the above-mentioned luminescent zone is adjacent to the anode, and a layer adjacent to the anode of the organic thin film layer(s) forming the luminescent zone contains a compound expressed in the above-described general formula [3.1] in the form of a single substance or a mixture containing the same.

DETAILED DESCRIPTION

Figure 1:
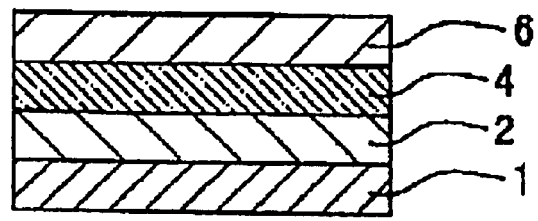
FIG. 1 is a schematic sectional view illustrating one example of an organic electroluminescent device of the present invention.

In the present invention, a bis(diarylamino)arylene compound into which a hydrocarbon group which may include an oxygen atom has been introduced is used as a material of an organic EL device. Namely, compounds expressed in the general formula [1.1] in which at least one of groups represented by $Ar_2$ to $Ar_5$ has at least a hydrocarbon group which may include an oxygen atom are used. Resultantly, intermolecular interaction between compounds expressed in the general formula [1.1] is reduced, and concentration quenching is suppressed.

Though the reason for this is not evident, it is estimated that, by introduction of a hydrocarbon group which may include an oxygen atom, steric hindrance occurs between compounds expressed in the general formula [1.1], and the interaction is reduced.

Consequently, the resulted EL device shows sufficient luminescent brilliance and EL property.

Further, when a saturated hydrocarbon group having two or more carbon atoms in which oxygen atom(s) may be inserted is used as the hydrocarbon group which may include an oxygen atom, concentration quenching is particularly suppressed. As the saturated hydrocarbon group having two or more carbon atoms which may include an oxygen atom, there can be used alkyl groups having two or more carbon atoms, alkoxy groups having two or more carbon atoms, alkoxyalkyl groups having two or more carbon atoms, and the like.

In this case, into which group of $Ar_2$ to $Ar_5$ is introduced a saturated hydrocarbon group having two or more carbon atoms which may include an oxygen atom is determined in view of the properties, productivity and the like of the resulted EL device.

Specifically, in the general formula [2.1], a saturated hydrocarbon group having two or more carbon atoms in which oxygen atom(s) may be inserted may sometimes be introduced into an aryl group other than a group represented by the general formula [2.2].

In this case, from the standpoint of steric hindrance and the like, a saturated hydrocarbon group having two or more carbon atoms in which oxygen atom(s) may be inserted may sometimes be bonded with at least one of carbon atom directly bonding to a carbon atom bonding to a nitrogen atom on the aryl group.

For example, if the saturated hydrocarbon group having two or more carbon atoms in which oxygen atom(s) may be inserted is a butyl group, 2-butylphenyl group, 2,6-dibutylphenyl group, 2,6,4-tributylpheyl group and the like may sometimes be used as Ar.

When one aryl group having a saturated hydrocarbon group having two or more carbon atoms in which oxygen atom(s) may be inserted is present, which of $Ar_2$ to $Ar_5$ is used as the aryl group having a saturated hydrocarbon group having two or more carbon atoms which may include an oxygen atom is determined in view of the properties, productivity and the like of the resulted EL device.

When two aryl groups having a saturated hydrocarbon group having two or more carbon atoms in which oxygen atom(s) may be inserted are present, these may be bonded to the same nitrogen atom, or may be bonded to different nitrogen atoms. Specifically, there are a case in which $Ar_2$ and $Ar_4$ represent an aryl group having the saturated hydrocarbon, a case in which $Ar_2$ and $Ar_5$ represent an aryl group having the saturated hydrocarbon, a case in which $Ar_3$ and $Ar_4$ represent an (aryl group having the saturated hydrocarbon, a case in which $Ar_3$ and $Ar_5$ represent an aryl group having the saturated hydrocarbon, a case in which $Ar_2$ and $Ar_3$ represent an aryl group having the saturated hydrocarbon, and a case in which $Ar_4$ and $Ar_5$ represent an aryl group having the saturated hydrocarbon. Which of them is used as the aryl group having a hydrocarbon group having two or more carbon atoms in which oxygen atom(s) may be inserted is determined in view of the properties, productivity and the like of the resulted EL device.

When three aryl groups having a saturated hydrocarbon group having two or more carbon atoms in which oxygen atom(s) may be inserted are present, there can be a case in which $Ar_2$, $Ar_3$ and $Ar_4$ represent an aryl group having the saturated hydrocarbon group; a case in which $Ar_2$, $Ar_3$ and $Ar_5$ represent an aryl group having the saturated hydrocarbon group; a case in which $Ar_3$, $Ar_4$ and $Ar_5$ represent an aryl group having the saturated hydrocarbon group; and a case in which $Ar_2$, $Ar_4$ and $Ar_5$ represent an aryl group having the saturated hydrocarbon group. Which of them is used as the aryl group having a hydrocarbon group having two or more carbon atoms in which oxygen atom(s) may be inserted is determined in view of the properties, productivity and the like of the resulted EL device.

On the other hand, there is also a case in which a saturated hydrocarbon group having two or more carbon atoms in which oxygen atom(s) may be inserted is introduced into a group expressed in the general formula [2.2], namely, at least of $R_1$ to $R_{11}$ is a saturated hydrocarbon group having two or more carbon atoms in which oxygen atom(s) may be inserted.

In this case, from the standpoint of steric hindrance and the like, there is sometimes a case in which $R_1$, $R_4$, or $R_1$ and $R_4$ represent a saturated hydrocarbon group having two or more carbon atoms in which oxygen atom(s) may be inserted.

When one group expressed in the general formula [2.2] having a saturated hydrocarbon group having two or more carbon atoms in which oxygen atom(s) may be inserted is present, which of $Ar_2$ to $Ar_3$ is used as the group having a saturated hydrocarbon group having two or more carbon atoms in which oxygen atom(s) may be inserted is determined in view of the properties, productivity and the like of the resulted EL device.

When two groups expressed in the general formula [2.2] having a saturated hydrocarbon group having two or more carbon atoms in which oxygen atom(s) may be inserted are present, these may be bonded to the same nitrogen atom, or may be bonded to different nitrogen atoms. Specifically, there are a case in which $Ar_2$ and $Ar_4$ represent the group having a saturated hydrocarbon, a case in which $Ar_2$ and $Ar_5$ represent the group having a saturated hydrocarbon, a case in which $Ar_3$ and $Ar_4$ represent the group having a saturated hydrocarbon, a case in which $Ar_3$ and $Ar_5$ represent the group having a saturated hydrocarbon, a case in which $Ar_2$ and $Ar_3$ represent the group having a saturated hydrocarbon and a case in which $Ar_4$ and $Ar_5$ represent the group having a saturated hydrocarbon. Which of them is used as the group expressed in the general formula [2.2] having a hydrocarbon group having two or more carbon atoms in which oxygen atom(s) may be inserted is determined in view of the properties, productivity and the like of the resulted EL device.

When three groups expressed in the general formula [2.2] having a saturated hydrocarbon group having two or more carbon atoms in which oxygen atom(s) may be inserted are present, there can be a case in which $Ar_2$, $Ar_3$ and $Ar_4$ represent the group having a saturated hydrocarbon group; a case in which $Ar_2$, $Ar_3$ and $Ar_5$ represent the group having a saturated hydrocarbon group; a case in which $Ar_3$, $Ar_4$ and $Ar_5$ represent the group having a saturated hydrocarbon group; and a case in which $Ar_2$, $Ar_4$ and $Ar_5$ represent the group having a saturated hydrocarbon group. Which of them is used as the group expressed in the general formula [2.2] having a hydrocarbon group having two or more carbon atoms in which oxygen atom(s) may be inserted is determined in view of the properties, productivity and the like of the resulted EL device.

Further, there is also a case in which $Ar_2$ to $Ar_5$ all represent the group expressed in the general formula [2.2] having a saturated hydrocarbon group having two or more carbon atoms in which oxygen atom(s) may be inserted.

In the present invention, there is also a case in which $R_6$ is a hydrocarbon-based substituent which may include oxygen atom(s), in a compound expressed in the general formula [1.2]. In this case, chemical stability of a group expressed in the general formula [1.2] is increased.

Specifically, as the distyryldiarylaminoarylene compound used in an organic EL device, a styryl group having a substituent on β-position is preferable. In the general formula [3.2], $R_6$ is a substituent other than a hydrogen atom. As a result, a compound expressed in the general formula [3.1] has sufficient chemical stability even when both of two aryl groups in the diarylamino group comprise a styryl group at the same time, namely, when both of $Ar_1$ and $Ar_3$ are a substituent expressed in the general formula [3.1].

Though the reason for this is not evident, it is estimated that, since hydrogen on β-position of a styryl group tends to cause a chemical reaction and the like, deterioration of a compound expressed in the general formula [3.1] by a chemical reaction and the like can be suppressed by substituting this hydrogen with chemically stable $R_6$.

As a result, the EL device has sufficiently higher luminescent brilliance, can suppress reduction in luminescent property, and realizes high durability.

It is preferable that $R_6$ is an aryl group having 6 to 20 carbon atoms due to excellent chemical stability and the like.

Also, because of the same reason, $R_6$ is preferably a substituted or unsubstituted alkyl group, or a substituted or unsubstituted cycloalkyl group. Further, in the present invention, at least both of $Ar_2$ and $Ar_3$ represent a substituent expressed in the general formula [3.2], however, when symmetrical property of the general formula [3.1] is taken into account, it is also permissible that at least both of $Ar_4$ and $Ar_5$ represent a substituent expressed in the general formula [3.2].

Further, there is also a case in which, in addition $Ar_2$ and $Ar_3$, $Ar_4$ and $Ar_5$ also each independently represents a group expressed in the general formula [3.2], for reasons of easy production, excellent property of the resulted EL device, and the like. Namely, there is also a case in which $Ar_2$ to $Ar_5$ all each independently represents a group expressed in the general formula [3.2].

Suitable practical embodiments of the present invention will be illustrated in more detail below.

$Ar_1$ is not particularly restricted providing it is a substituted or unsubstituted arylene group having 5 to 42 carbon atoms, and examples thereof include a naphthyl group, anthranyl group, perylenylene group, 1:2 benzoperylenylene group, 1:2:7:8 dibenzoperylenylene group, 1:2:11:12 dibenzoperylenylene group, terylenylene group, pentacenylene group, bisanthrenylene group. 10,10'-(9.9'-bianthryl)ylene group, 4,4'-(1,1'-binaphthyl)ylene group, 4,10'-(1,9'-naphthylanthryl)ylene group, divalent groups expressed in the following general formula [1.3]:

[1.3]

(wherein, $Ar_6$ to $Ar_8$ each independently represent a naphthyl group or anthranyl group), divalent groups obtained by removing two hydrogen atoms from aromatic hydrocarbons or condensed polycyclic hydrocarbons such as phenanthrene, pyrene, biphenyl, terphenyl and the like, heterocyclic compounds or condensed heterocyclic compounds such as carbazole, pyrrole, thiophene, furane, imidazole, pyrazole, isothiazole, isooxazole, pyridine, pyrazine, pyrimidine, pyridazine, furazane, thianthrene, isobenzofuran, phenoxazine indolidine, indole, isoindole, 1H-indazole, purine, quinoline, isoquinoline, phthalazine, naphthylidine, quinoxaline, quinazoline, cinnoline, pteridine, carbazole, 6-carbazoline, phenanthrydine, acrydine, perymidine, phenanthroline, phenadine, phenothiazine, phenoxazine and the like, and derivatives thereof.

Examples of the aryl group having 6 to 20 carbon atoms include a phenyl group, naphthyl group, anthryl group, phenanthryl group, naphthacenyl group, pyrenyl group and the like. Examples of the substituted or unsubstituted alkyl group include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3,-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group and the like.

Examples of the substituted or unsubstituted alkenyl group include a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, 3-phenyl-1-butenyl group and the like.

Examples of the substituted or unsubstituted cycloalkyl group include a cyclopropyl group, cyclobutyl group, cyclopentyl group, cyclohexyl group, 4-methylcyclohexyl group and the like.

The substituted or unsubstituted alkoxy group is a group represented by —OY, and examples of Y include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3 -dihydroxyisopropyl group, 2,3-dihydroxy-t-butyl group, 1,2,3-trihydroxypropyl group, chloromethyl group. 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group. 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group and the like. Examples of the substituted or unsubstituted aromatic hydrocarbon group include a phenyl group, 1-naphthyl group, 2-naphthyl group, 1-anthranyl group, 2-anthranyl group, 9-anthryl group, 1-phenanthryl group, 2-phenanthryl group, 3-phenanthrylgroup, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terpheyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropypl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group and the like.

Examples of the substituted or unsubstituted aromatic heterocyclic group include a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group. 7-benzofuranyl group. 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group. 7-quinolyl group, 8-quinolyl group, 1-isoquinolyl group, 3-isoquinolyl group, 4-isoquinolyl group, 5-isoquinolyl group, 6-isouqinolyl group, 7-isoquinolyl group, 8-isoquinolyl group, 2-quinoxalynyl group, 5-quinoxalynyl group, 6-quinoxalynyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acrydinyl group, 2-acrydinyl group, 3-acrydinyl group. 4-acrydinyl group, 9-acrydinyl group, 1,7-phenanthroline-2-yl group, 1,7-phenanathroline-3-yl group, 1,7-phenanthroline-4-yl group, 1,7-phenanthroline-5-yl group, 1,7-phenanthroline-6-yl group, 1,7-phenanathroline-7-yl group, 1,7-phenanthroline-8-yl group. 1,7-phenanthroline-9-yl group, 1,7-phenanthroline-10-yl group, 1,8-phenanthroline-2-yl group, 1,8-phenanathroline-3-yl group, 1,8-phenanthroline-4-yl group, 1,8-phenanthroline-5-yl group, 1,8-phenanthroline-6-yl group, 1,8-phenanathroline-7-yl group, 1,8-phenanthroline-8-yl group, 1,8-phenanthroline-9-yl group, 1,8-phenanthroline-10-yl group, 1,9-phenanthroline-2-yl group, 1,9-phenanathroline-3-yl group, 1,9-phenanthroline-4-yl group. 1,9-phenanthroline-5-yl group, 1,9-phenanthroline-6-yl group, 1,9-phenanathroline-7-yl group, 1,9-phenanthroline-8-yl group, 1,9-phenanthroline-9-yl group, 1,9-phenanthroline-10-yl group, 1,10-phenanthroline-2-yl group, 1,10-phenanathroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenadinyl group, 2-phenadinyl group, 1-phenothiadinyl group, 2-phenothiadinyl group, 3-phenothiadinyl group, 4-phenothiadinyl group, 10-phenothiadinyl group, 1-phenoxadinyl group, 2-phenoxadinyl group, 3-phenoxadinyl group, 4-phenoxadinyl group, 10-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-indolyl group, 4-t-butyl-1-indolyl group, 2-t-butyl-3-indolyl group, 4-t-butyl-3-indolyl group and the like.

Examples of the substituted or unsubstituted aralkyl group include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-iodobenzyl group, m-iodobenzyl group, o-iodobenzyl group, p-hydroxybenzyl group, m-hydroxybenzyl group, o-hydroxybenyzl group, p-aminobenyzl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, 1-chloro-2-phenylisopropyl group and the like.

The substituted or unsubstituted aryloxy group is represented by —OZ, and examples of Z include a phenyl group, 1-naphthyl group, 2-naphthyl group, 1-anthryl group, 2-anthryl group, 9-anthryl group, 1-phenanthryl group, 2-phenanthryl group, 3-phenenthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terpheyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropypl) phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isouqinolyl group, 7-isoquinolyl group, 8-isoquinolyl group, 2-quinoxalynyl group, 5-quinoxalynyl group, 6-quinoxalynyl group, 1-carbazolyl group, 2-carbazolyl group, 3-carbazolyl group, 4-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acrydinyl group, 2-acrydinyl group, 3-acrydinyl group, 4-acrydinyl group, 9-acrydinyl group, 1,7-phenanthroline-2-yl group, 1,7-phenanathroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group. 1,8-phenanthroline-2-yl group, 1,8-phenanathroline-3-yl group, 1,8-phenanthroline-4-yl group, 1,8-phenanthroline-5-yl group, 1,8-phenanthroline-6-yl group, 1,8-phenanathroline-7-yl group, 1,8-phenanthroline-9-yl group, 1,8-phenanthroline-10-yl group, 1,9-phenanthroline-2-yl group, 1,9-phenanathroline-3-yl group, 1,9-phenanthroline-4-yl group, 1,9-phenanthroline-5-yl group, 1,9-phenanthroline-6-yl group, 1,9-phenanathroline-7-yl group, 1,9-phenanthroline-8-yl group, 1,9-phenanthroline-9-yl group, 1,9-phenanthroline-10-yl group, 1,10-phenanthroline-2-yl group, 1,10-phenanathroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group. 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenadinyl group, 2-phenadinyl group, 1-phenothiadinyl group, 2-phenothiadinyl group, 3-phenothiadinyl group, 4-phenothiadinyl group, 1-phenoxadinyl group, 2-phenoxadinyl group, 3-phenoxadinyl group, 4-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrroly-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-indolyl group, 4-t-butyl-1-indolyl group, 2-t-butyl-3-indolyl group, 4-t-butyl-3-indolyl group and the like.

The substituted or unsubstituted alkoxycarbonyl group is represented by —COOY, and examples of Y include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3,-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group and the like.

Examples of the divalent group forming a ring include a tetramethylene group, pentamethylene group, hexamethylene group, diphenylmethane-2,2'-diyl group, diphenylethane-3,3'-diyl group, diphenylpropane-4,4'-diyl group and the like.

The substituted or unsubstituted amino group is represented by —NX$_1$X$_2$, and examples of X$_1$ and examples of X$_2$ include independently a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group. 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group. 2,3-dichloro-t-butyl group, 1,2,3-trichlorooropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group., 2-aminoisobutyl group, 1,2-diaminoethyl group, 1,3-diaminoisopropyl group, 2,3,-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3 -dinitro-t-butyl group, 1,2,3-trinitropropyl group and the like.

Specific examples of compounds expressed in the general formula [2.1] include, but are not limited to, the following compounds (2.1) to (2.20).

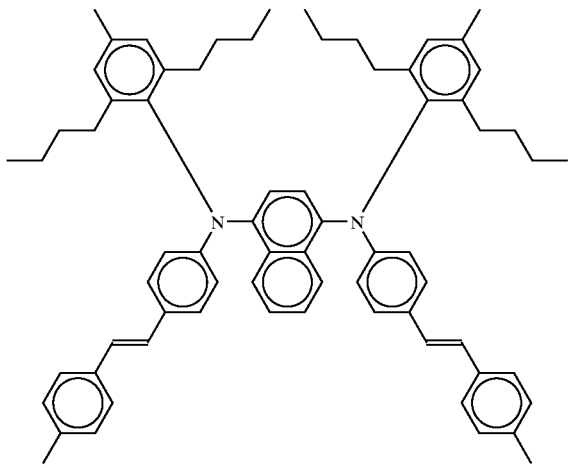

(2.1)

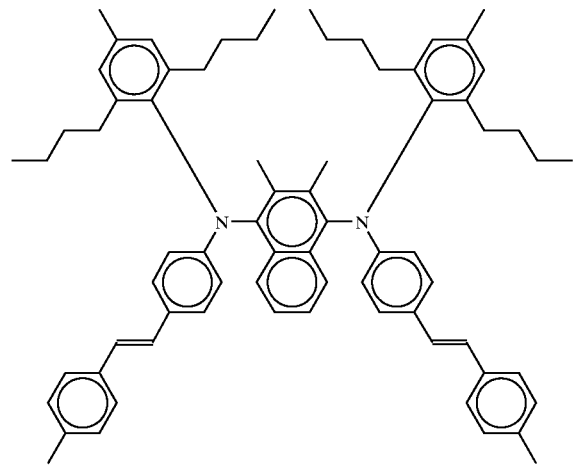

(2.2)

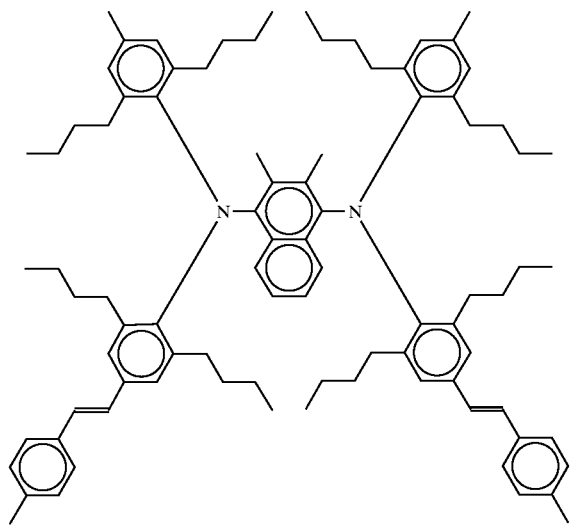

(2.3)

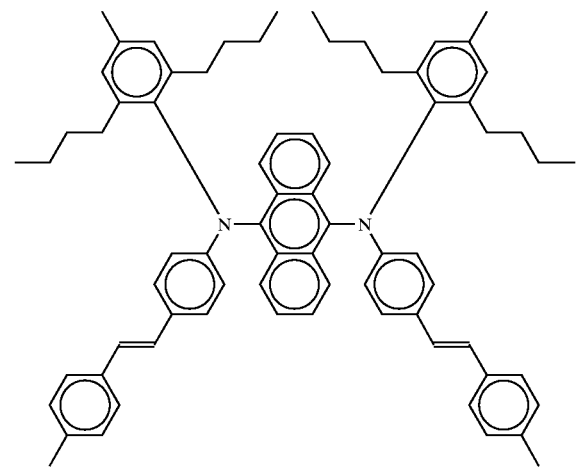

(2.4)

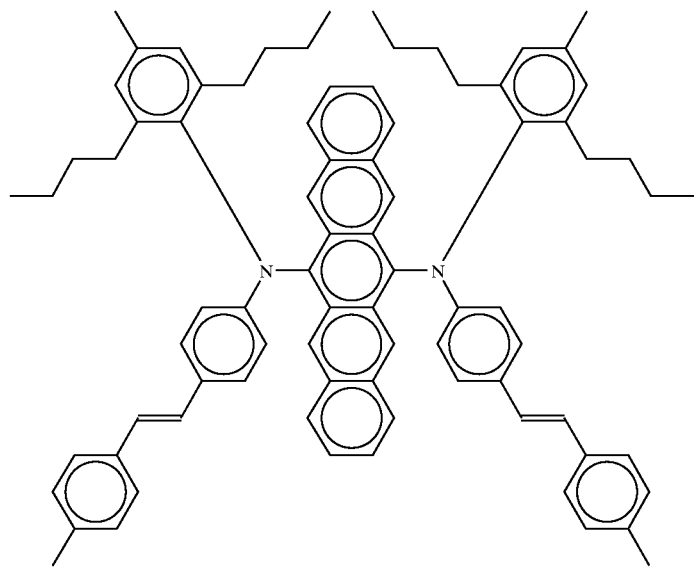
(2.5)
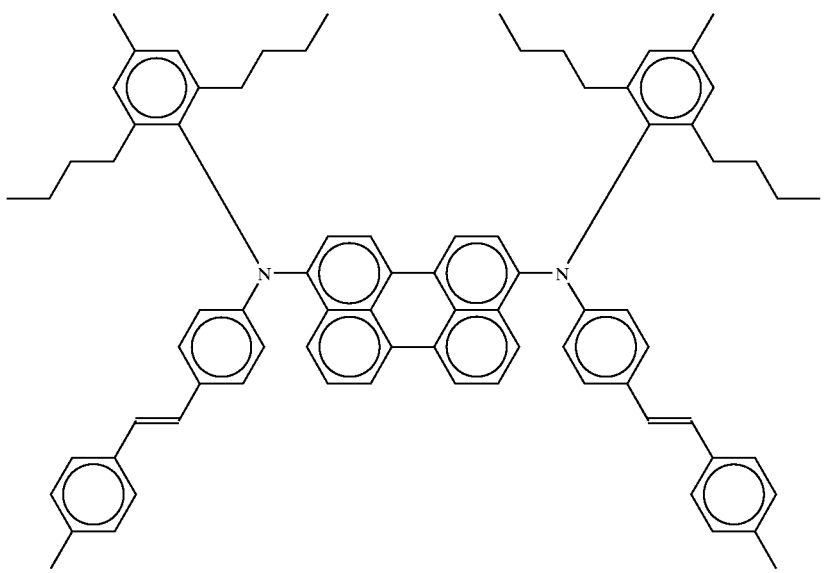
(2.6)

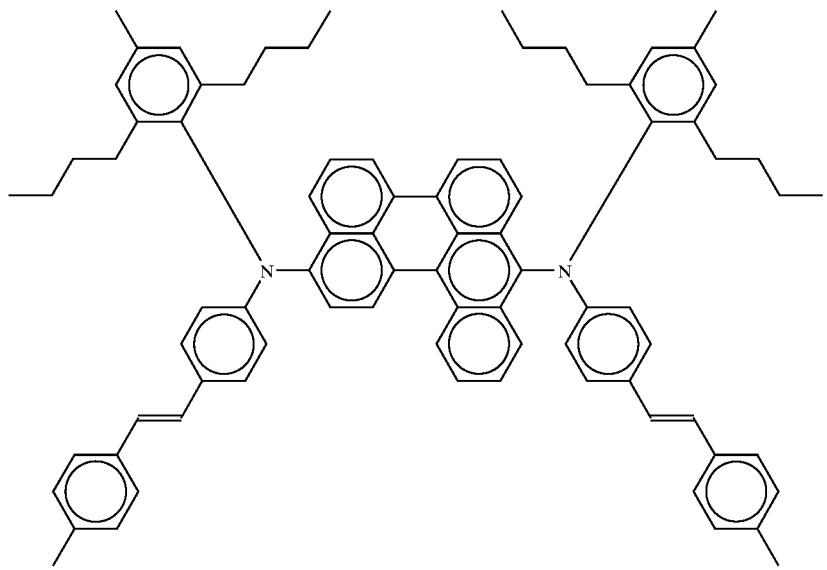
(2.7)
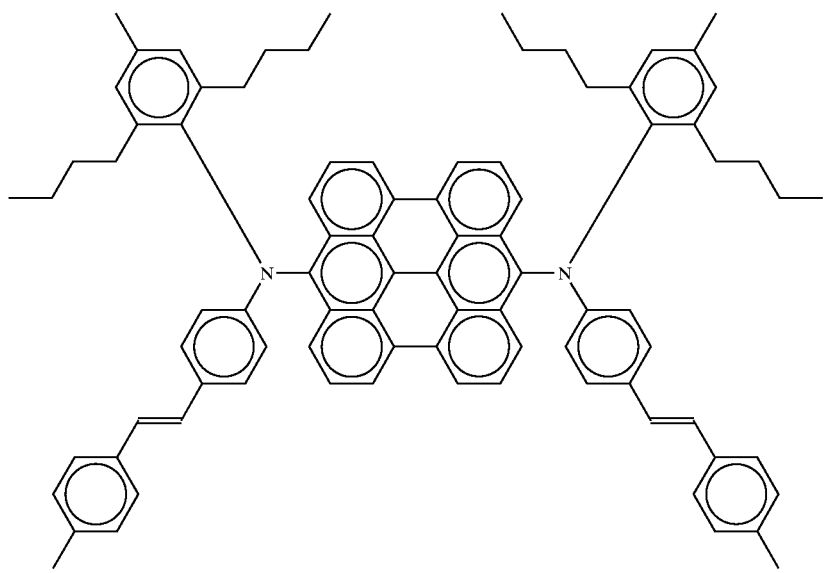
(2.8)

-continued
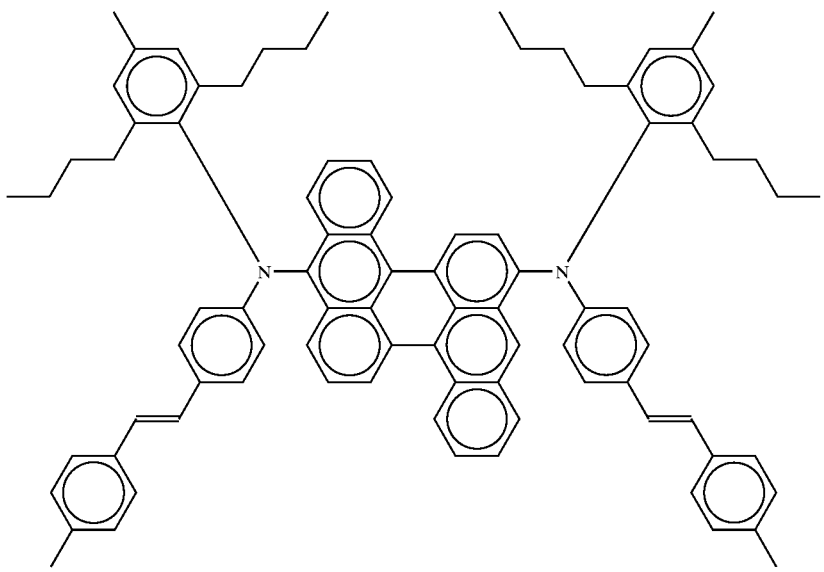
(2.9)
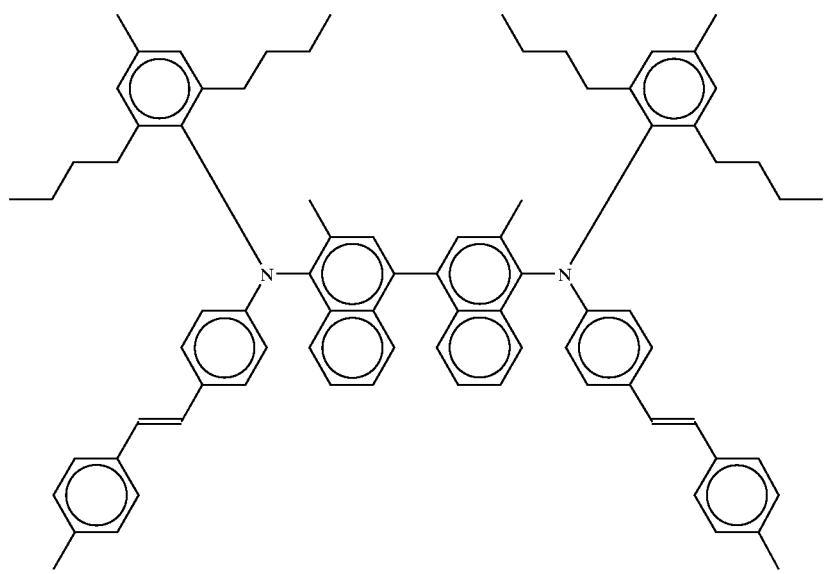
(2.10)

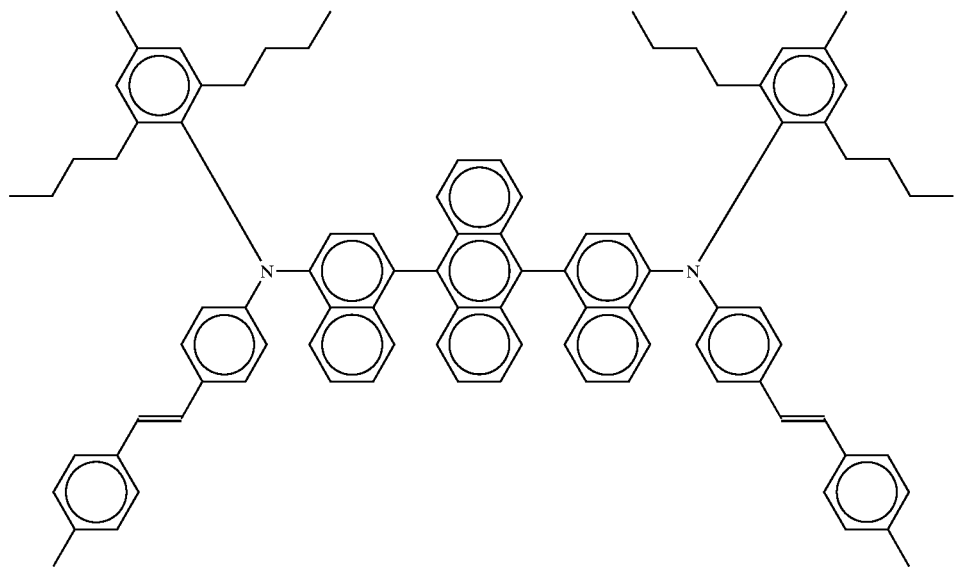
(2.11)
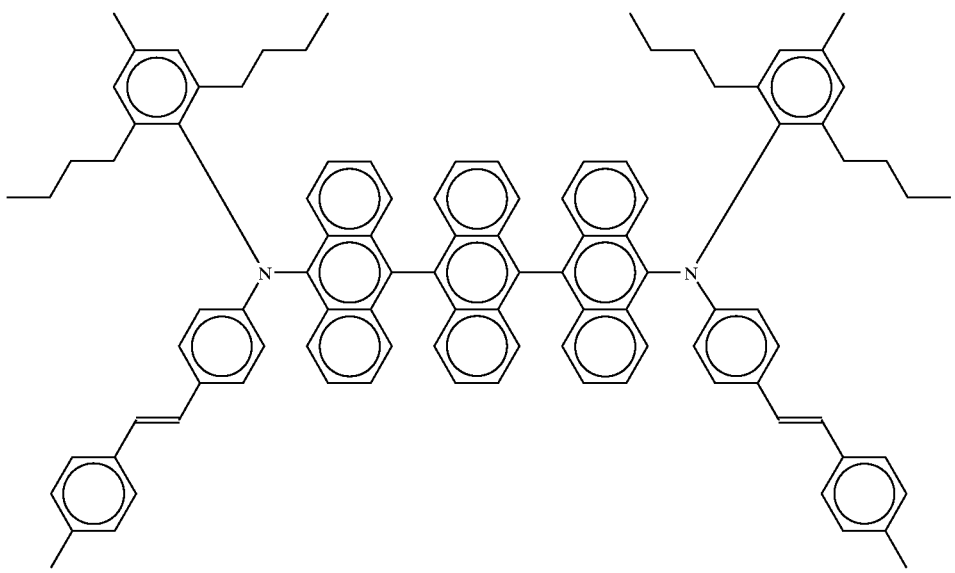
(2.12)

-continued
(2.13)
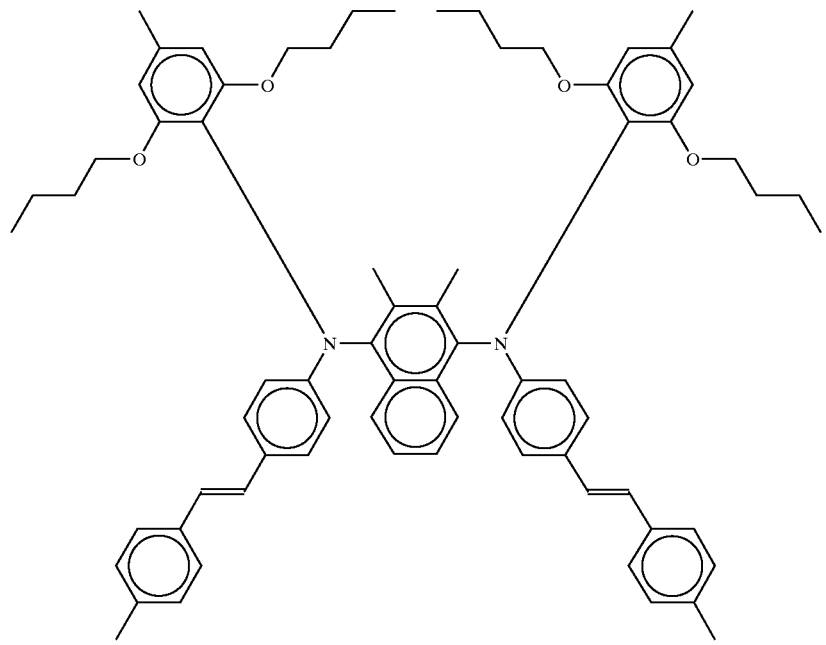
(2.14)
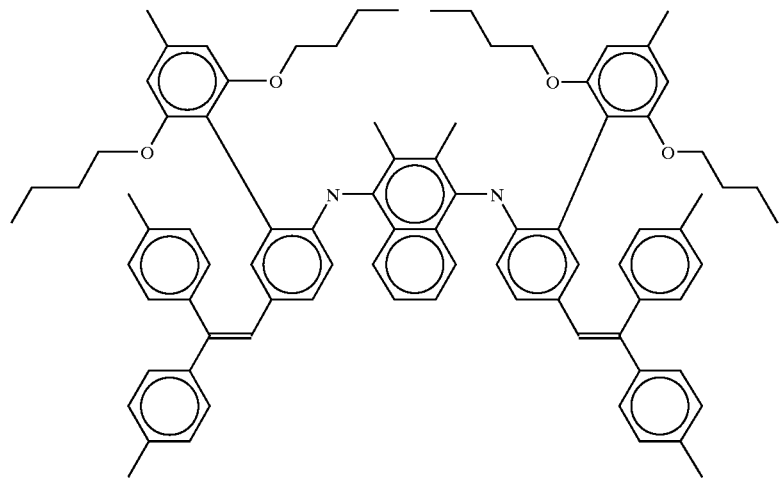
(2.15)
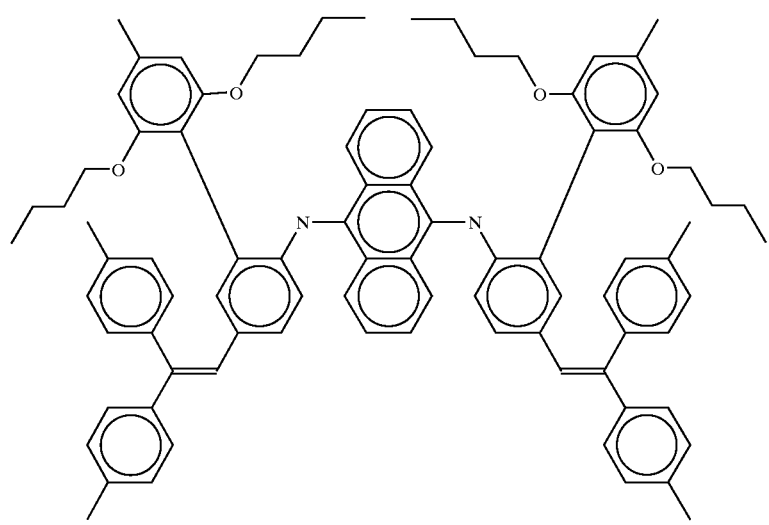

(2.16)
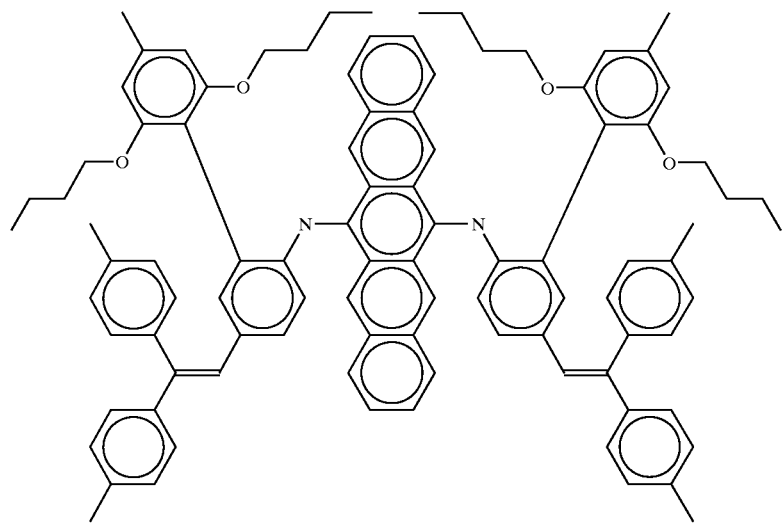
(2.17)
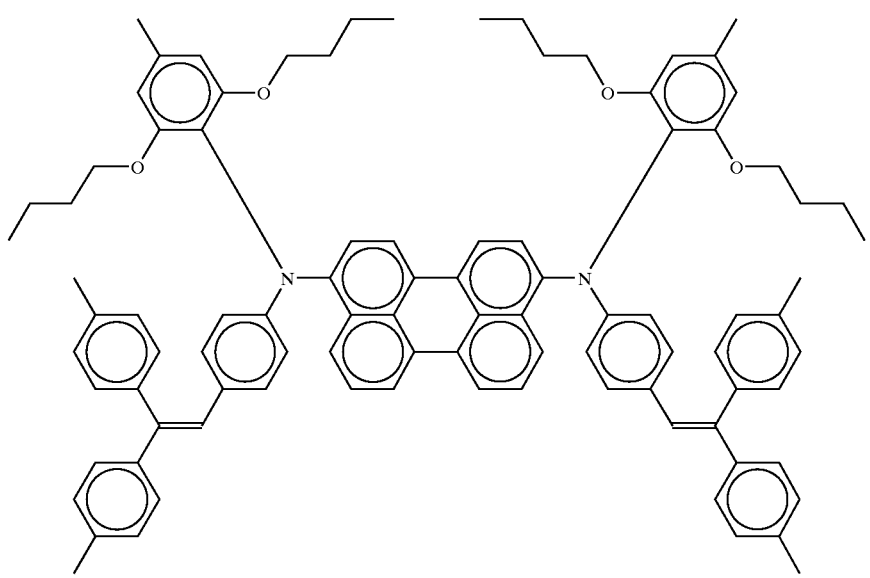

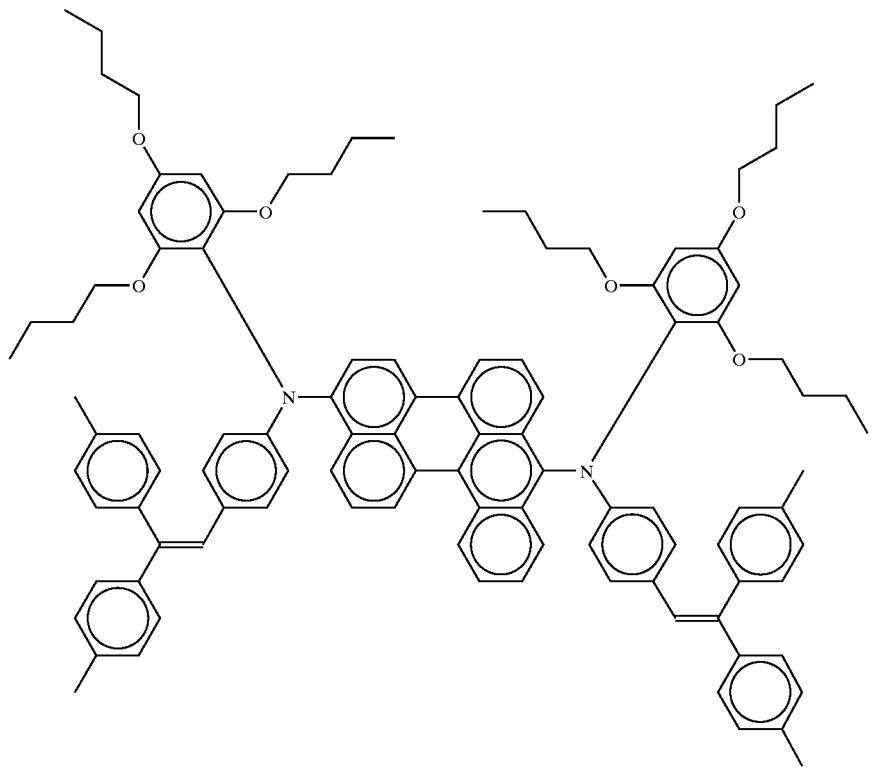
(2.18)
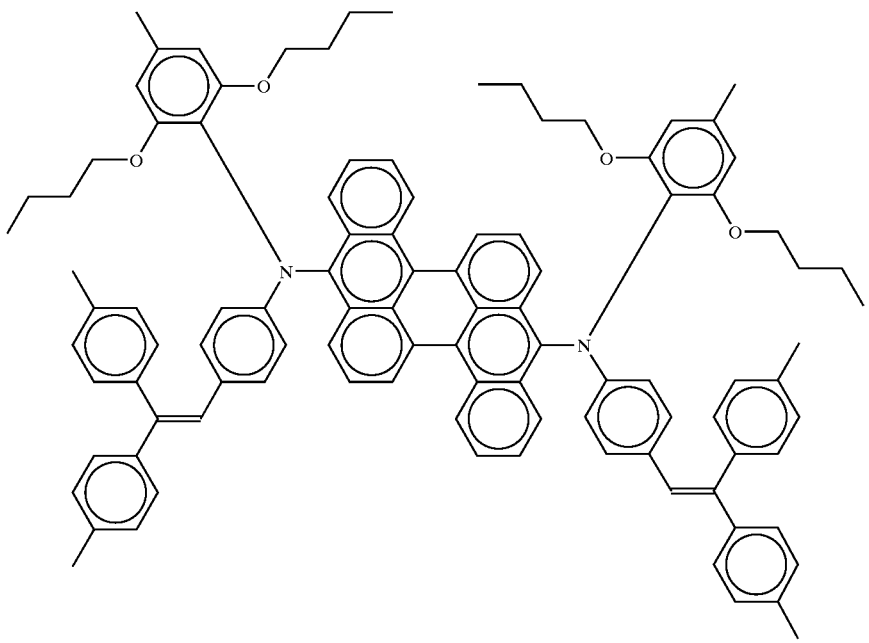
(2.19)

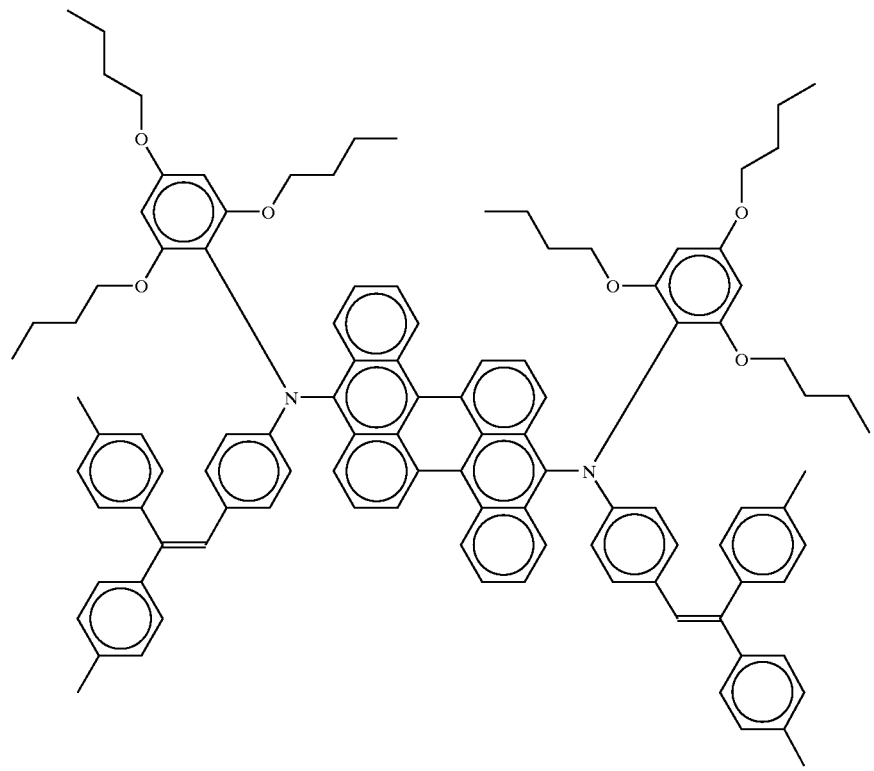
(2.20)
Specific examples of compounds expressed in the general formula [3.1] include, but are not limited to, the following compounds (3.1) to (3.30).
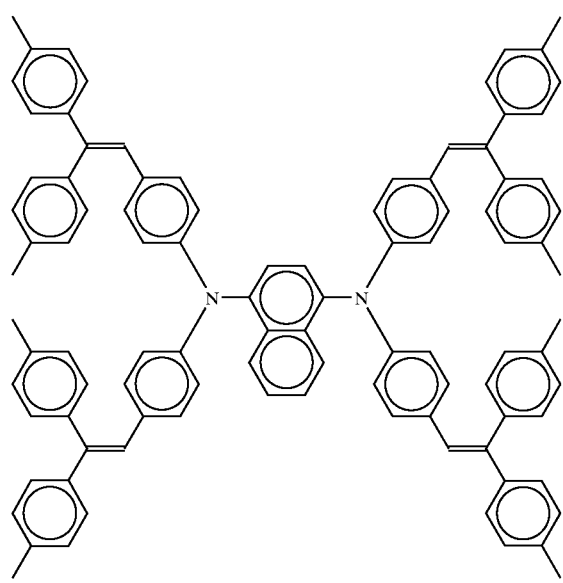
(3.1)
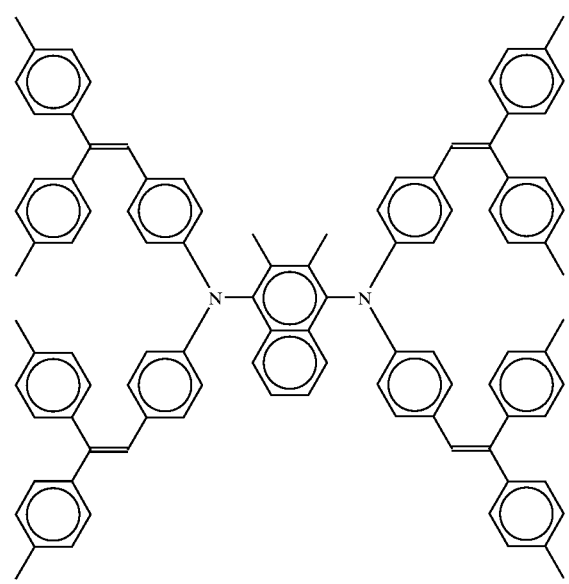
(3.2)

-continued
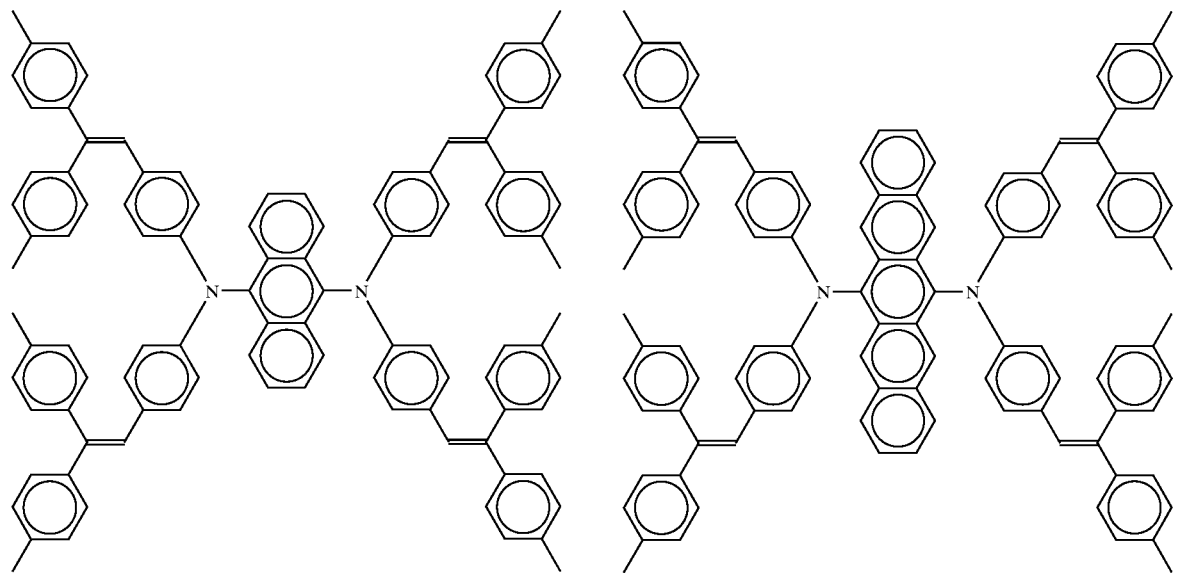
(3.3)
(3.4)
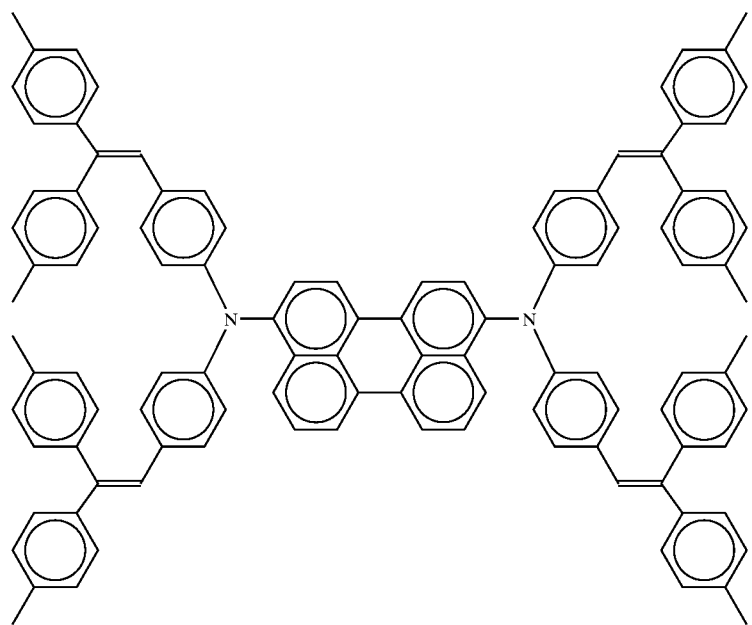
(3.5)

(3.6)
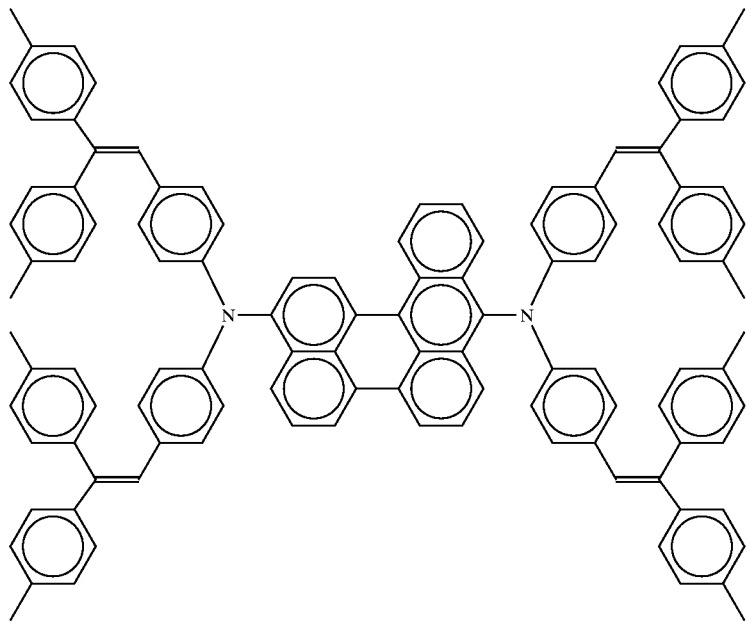
(3.7)
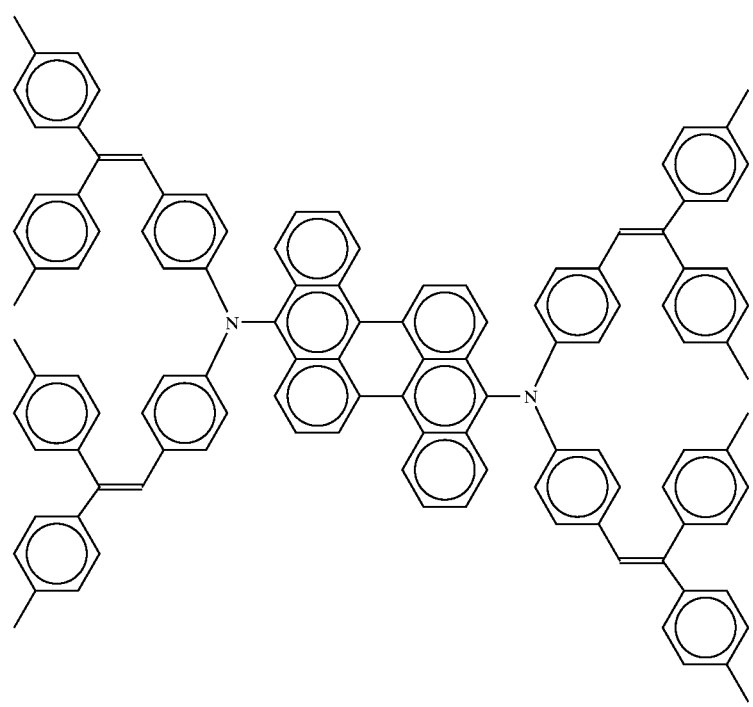

(3.8)
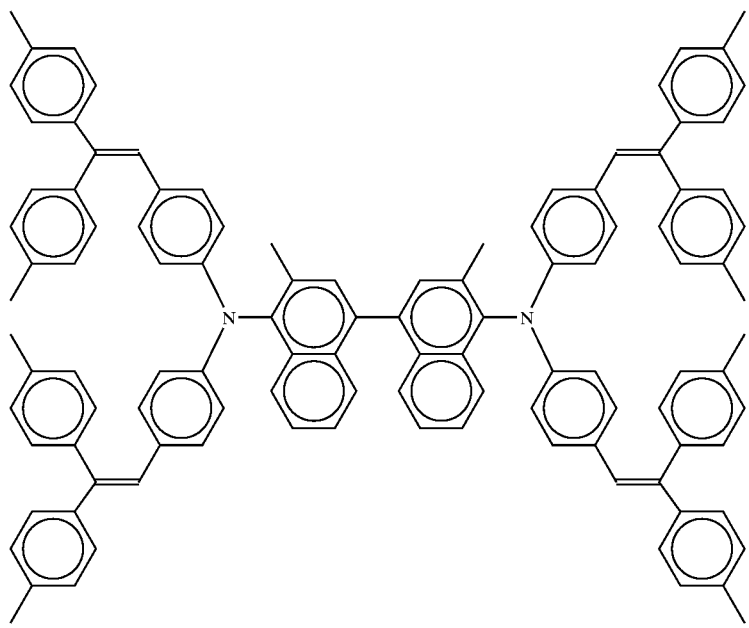
(3.9)
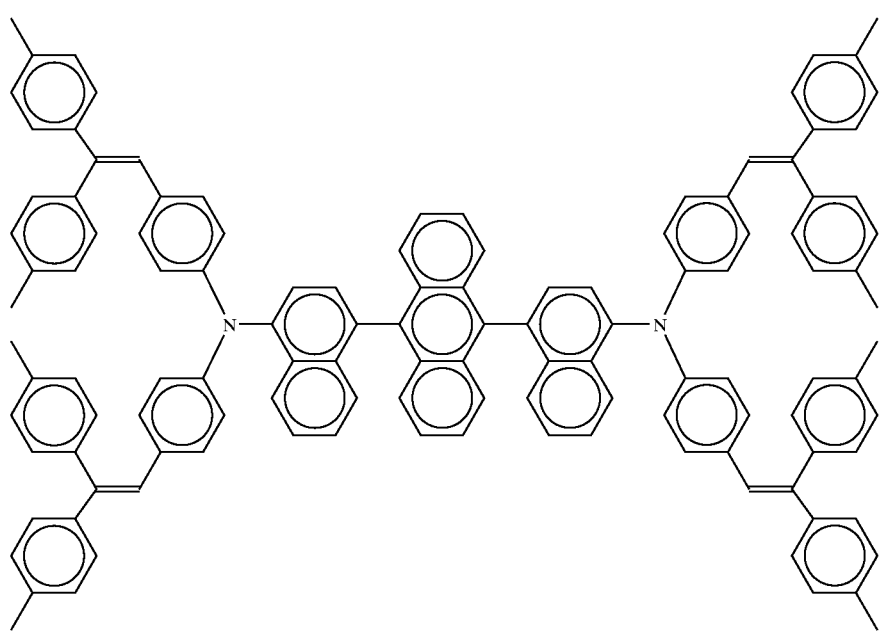

(3.10)
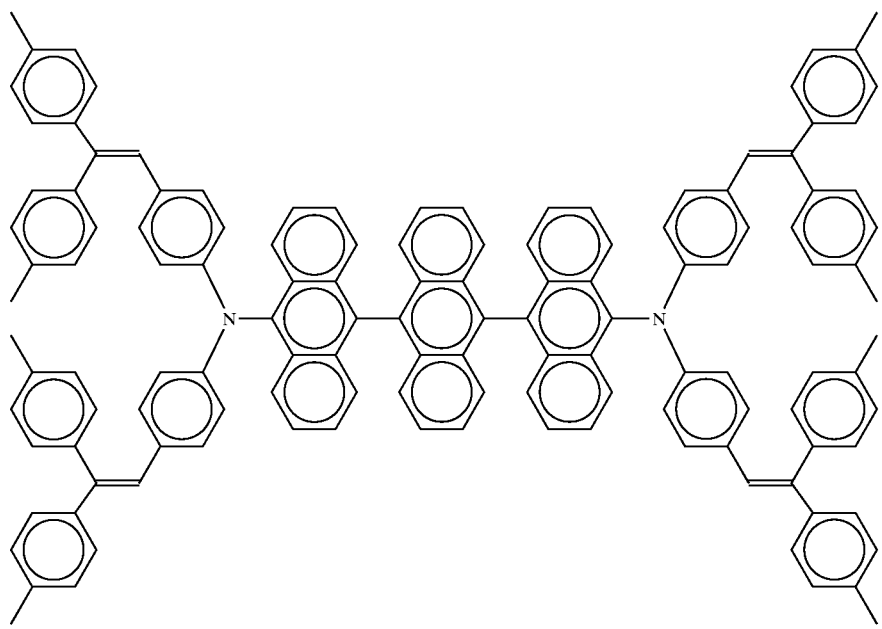
(3.11)
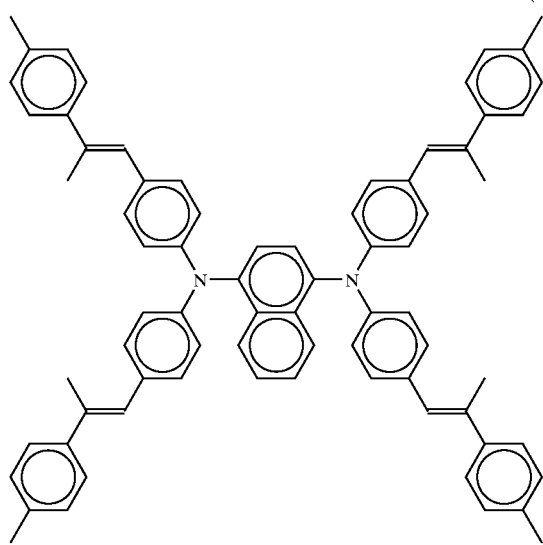
(3.12)
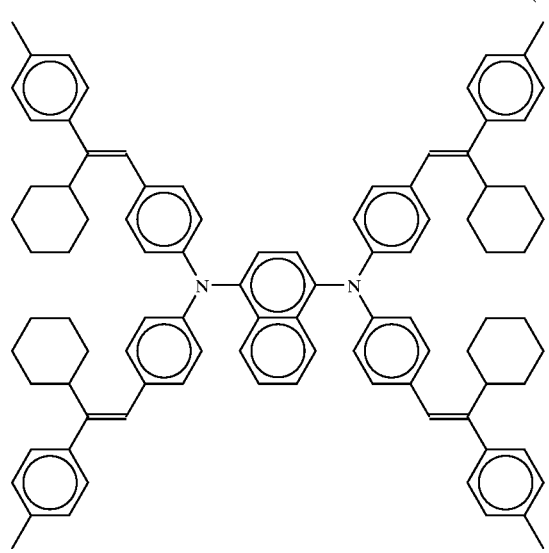

(3.13)
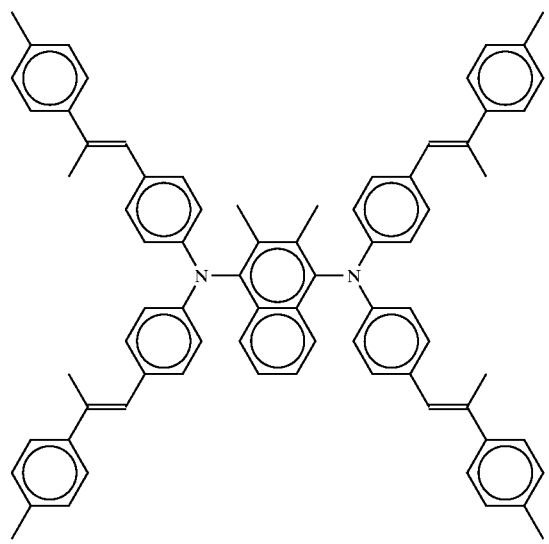
(3.14)
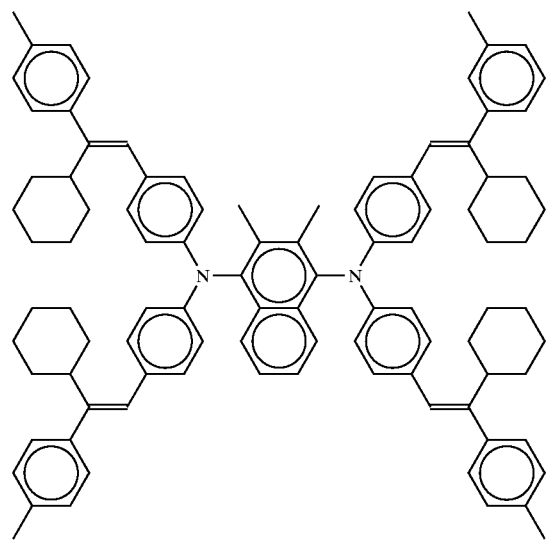
(3.15)
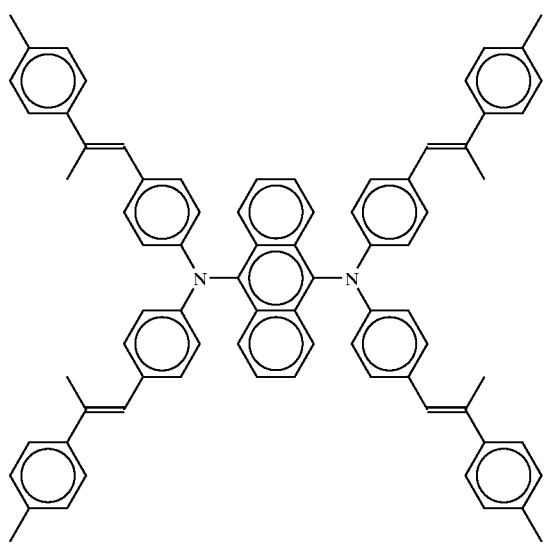
(3.16)
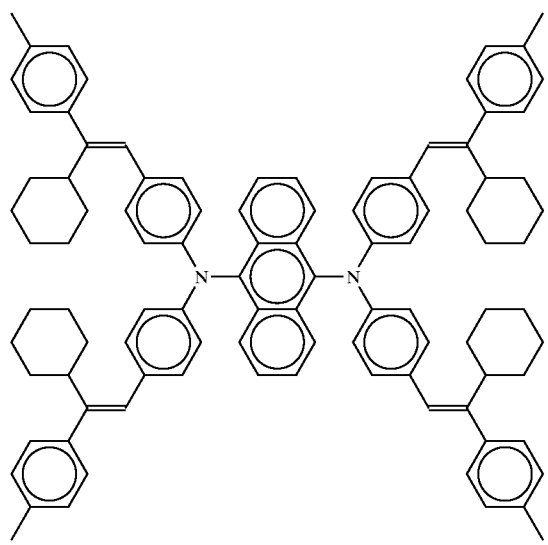

-continued
(3.17)
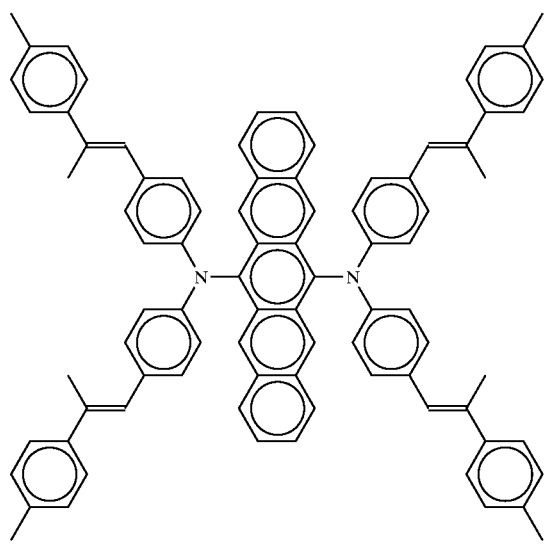
(3.18)
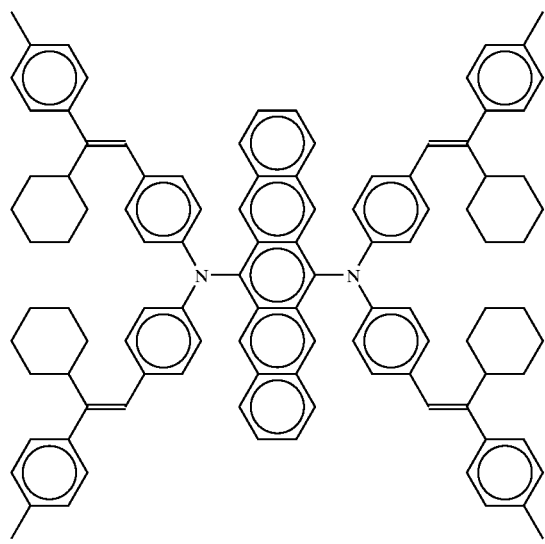
(3.19)
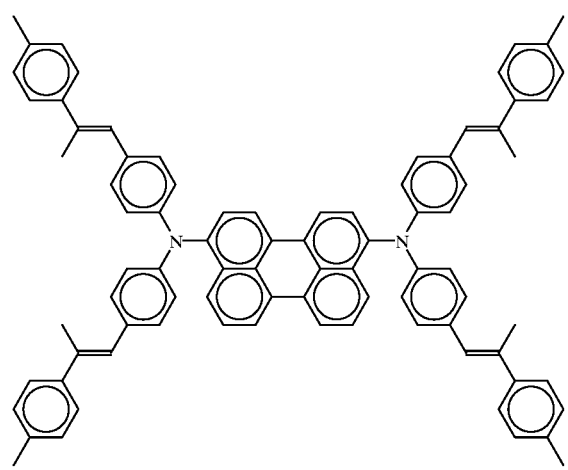
(3.20)
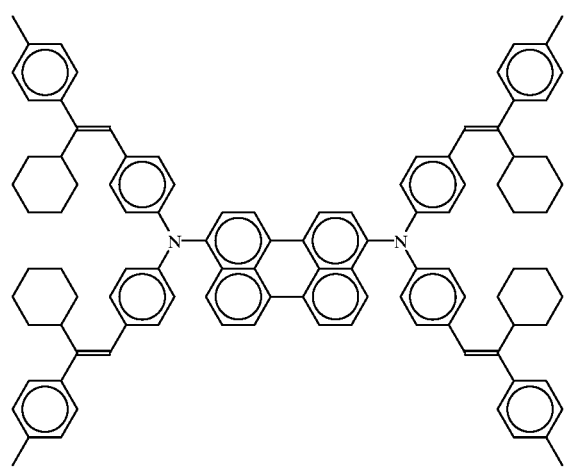
(3.21)
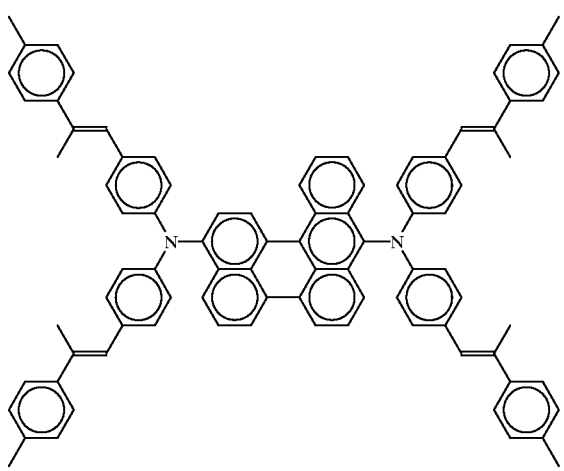
(3.22)
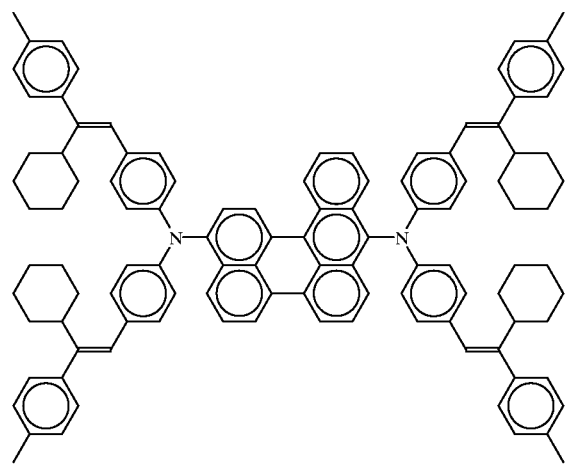

-continued
(3.23)
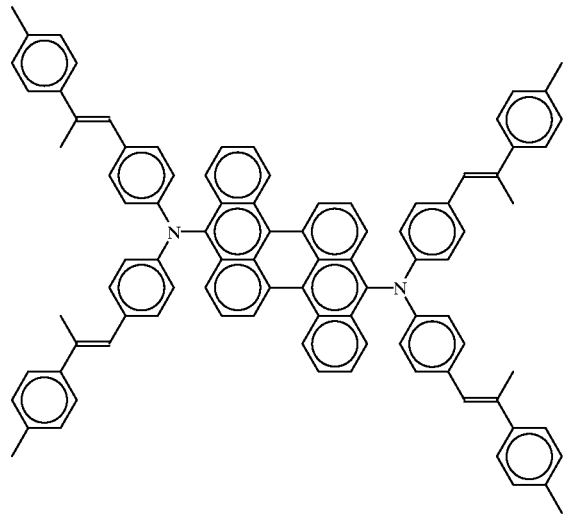
(3.24)
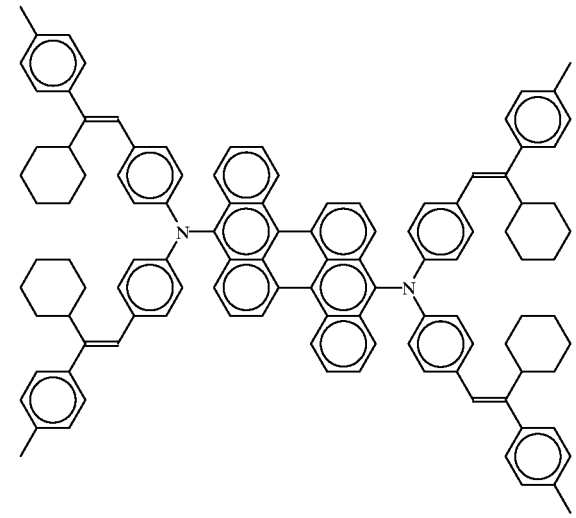
(3.25)
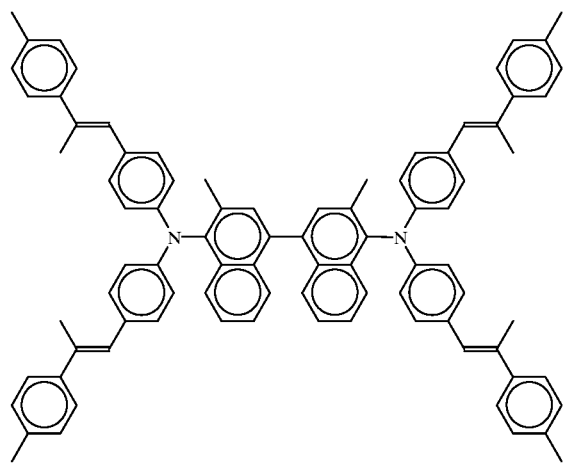
(3.26)
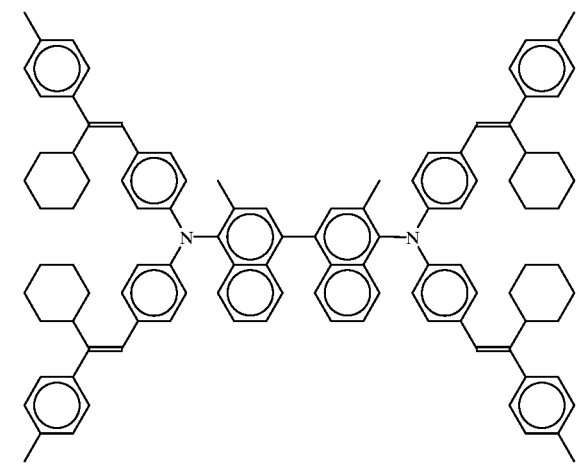

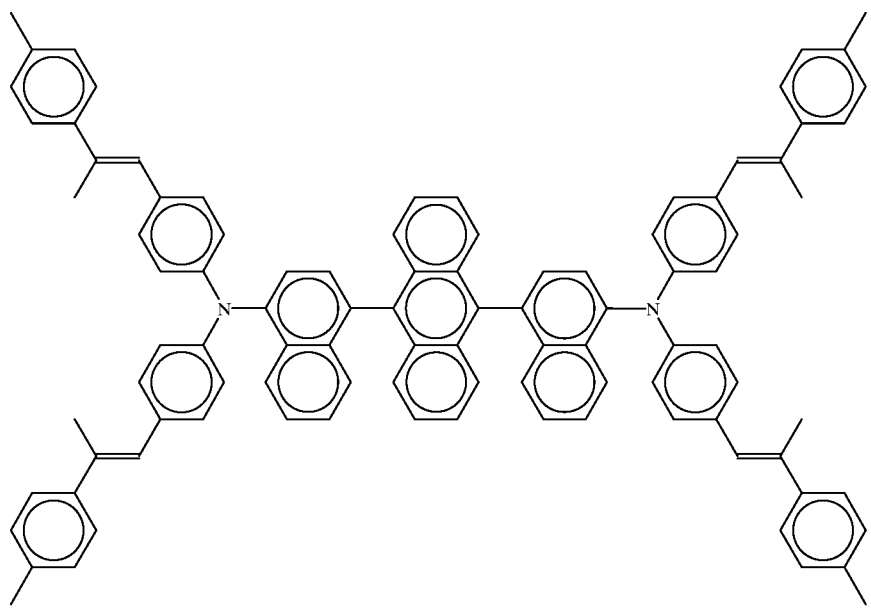
(3.27)
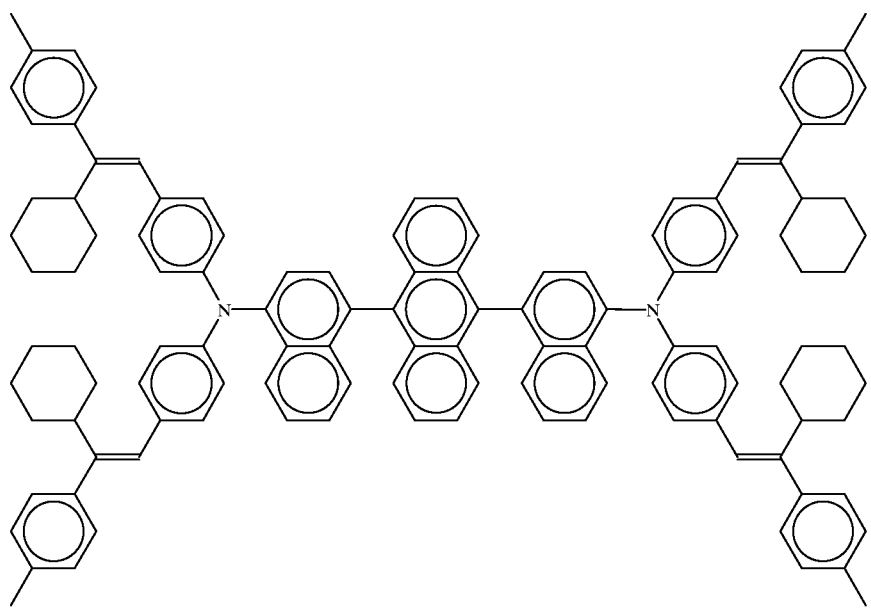
(3.28)

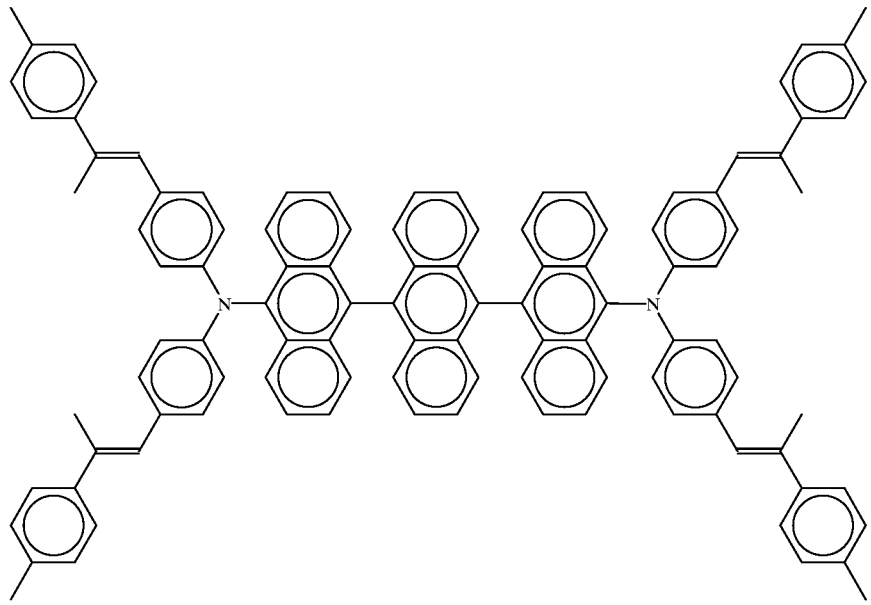

(3.29)

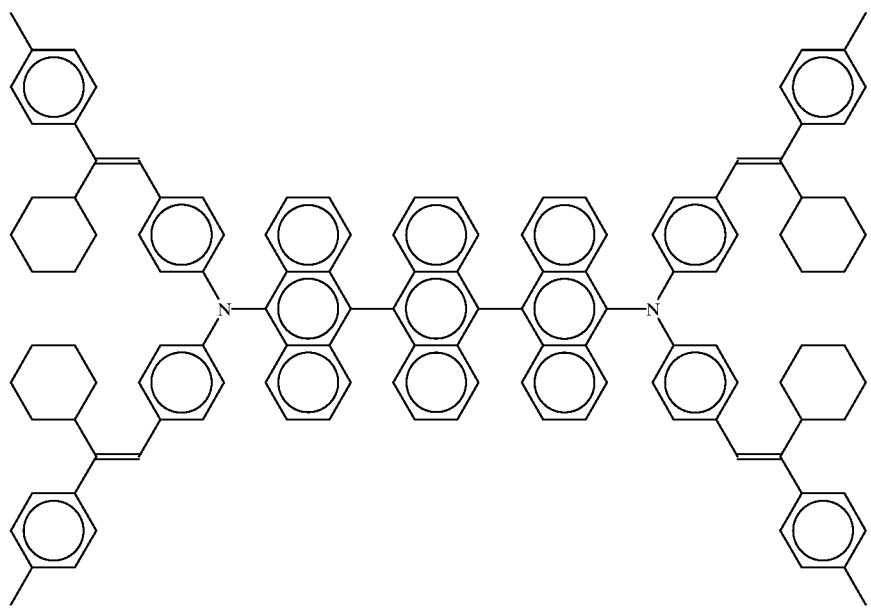

(3.30)

Figure 2:
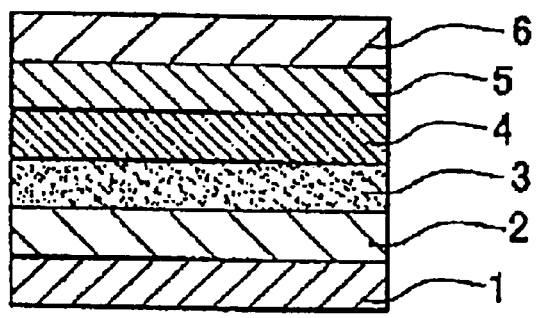
FIG. 2 is a schematic sectional view illustrating other example of an organic electroluminescent device of the present invention.
Figure 3:
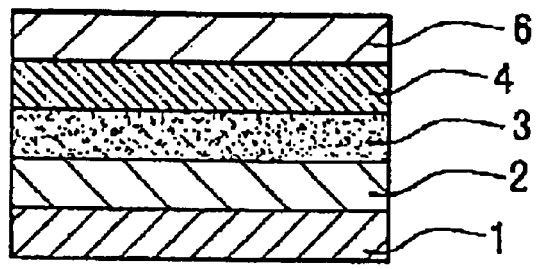
FIG. 3 is a schematic sectional view illustrating other example of an organic electroluminescent device of the present invention.
Figure 4:
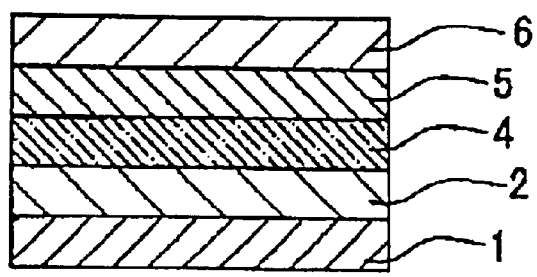
FIG. 4 is a schematic sectional view illustrating other example of an organic electroluminescent device of the present invention.

An organic EL device of the present invention has a device structure in which one or more organic thin film layers are laminated between electrodes, and there are listed, for example, a structure in which on a substrate 1, an anode 2, luminescent layer 4 and cathode 6 are laminated in this order as shown in FIG. 1, a structure in which on a substrate 1, an anode 2, hole transporting layer 3, luminescent layer 4, electron transporting layer 5 and cathode 6 are laminating in this order as shown in FIG. 2, a structure in which on a substrate 1, an anode 2, hole transporting layer 3, luminescent layer 4, and cathode 6 are laminated in this order as shown in FIG. 3, a structure in which on a substrate 1, an anode 2, luminescent layer 4, electron transporting layer 5 and cathode 6 are laminated in this order as shown in FIG. 4, and the like.

A compound expressed in the general formula [1.1] used in the present invention may be used in any of the above-mentioned organic thin film layers, and can also be doped in other layer, a hole transporting material, luminescent material, electron transporting material, and the like.

More specifically, there can be exemplified a structure in which at least one organic thin film layer is a hole transporting layer, and this hole transporting layer contains a compound expressed in the general formula [1.1] in the form of a single substance or a mixture containing the same. In this case, sufficient hole transporting efficiency can be realized.

Also, there can be exemplified a structure in which at least one organic thin film layer is an electron transporting layer, and this electron transporting layer contains a compound expressed in the general formula [1.1] in the form of a single substance or a mixture containing the same. In this case, sufficient electron transporting efficiency can be realized.

Further, there can be exemplified a structure in which a luminescent layer containing a compound expressed in the general formula [1.1] in the form of a single substance or a mixture containing the same is adjacent to an anode. In this case, since a hole transporting layer is not necessary, a production process can be simplified and productivity can be improved.

A hole transporting material used in the present invention is not particularly restricted, and those compounds usually used as a hole transporting agent can be used.

Examples thereof include triphenyldiamines such as bis (di(p-tolyl)aminophenyl)-1,1-cyclohexane (1.1), N,N'-diphenyl-N,N'-bis(3-methylphenyl)-1,1'-biphenyl-4,4'-diamine (1.2), N,N'-diphenyl-N-N-bis(1-naphthyl)-1,1'-biphenyl-4,4'-diamine (1.3) and the like, star burst form molecules ((1.4) to (1.6) and the like), show below, and the like.

(1.1)

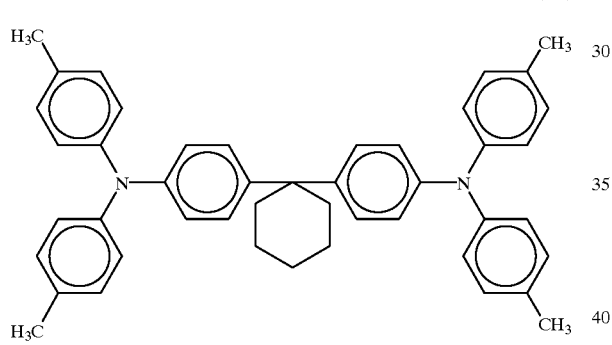

(1.2)

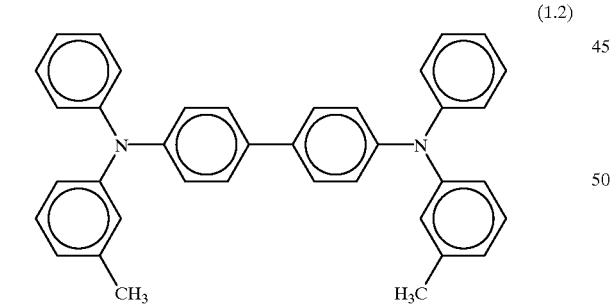

(1.3)

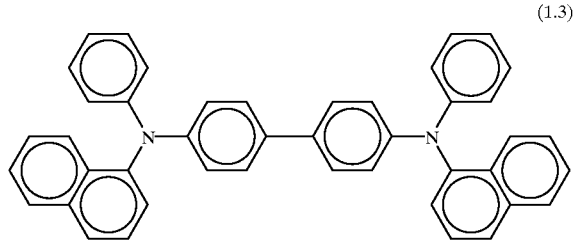

(1.4)

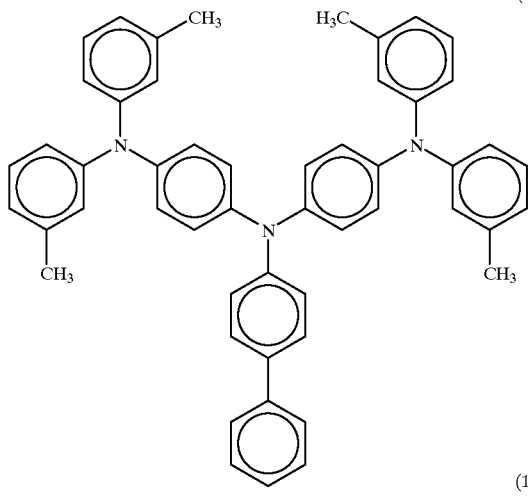

(1.5)

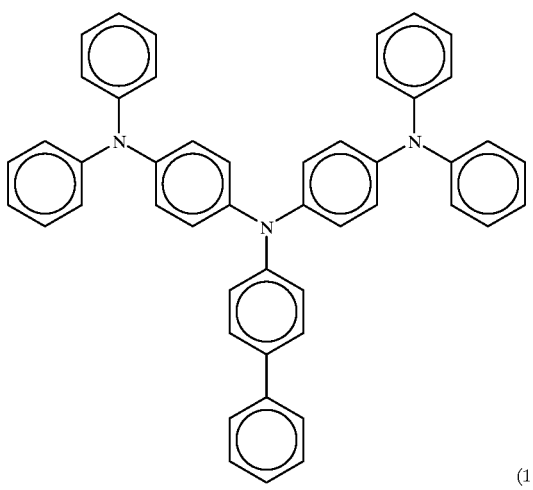

(1.6)

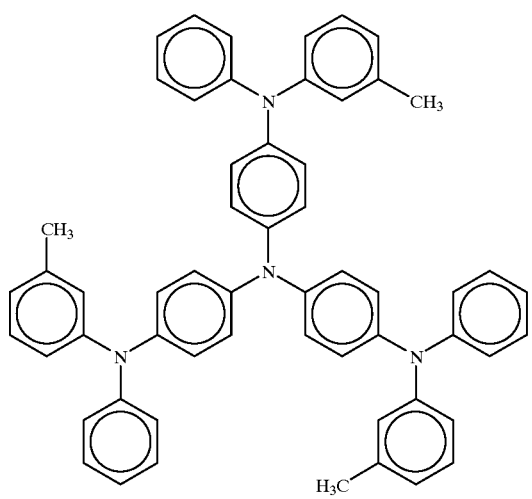

An electron transporting material used in the present invention is not particularly restricted, and those compounds usually used as an electron transporting agent can be used.

Examples thereof include oxadiazole derivatives such as 2-(4-biphenylyl)-5-(4-t-butylphenyl)-1,3,4-oxadiazole (1.7), bis{2-(4-t-butylphenyl)-1,3,4-oxadiazole}-m-phenylene (1.8) and the like, triazole derivatives ((1.9), (1.10) and the like), and the like.

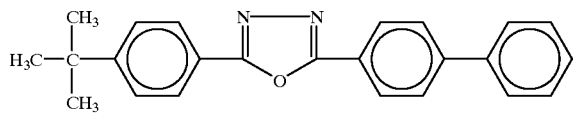
(1.7)

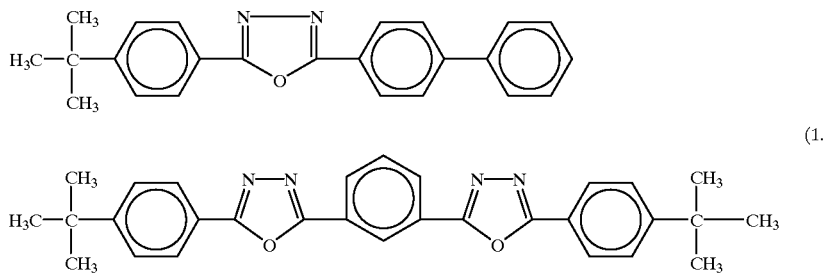
(1.8)

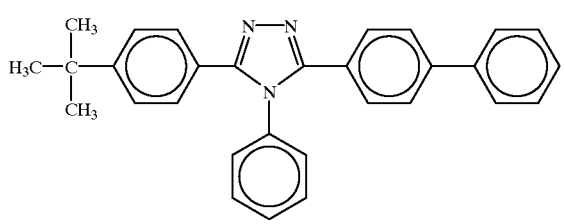
(1.9)

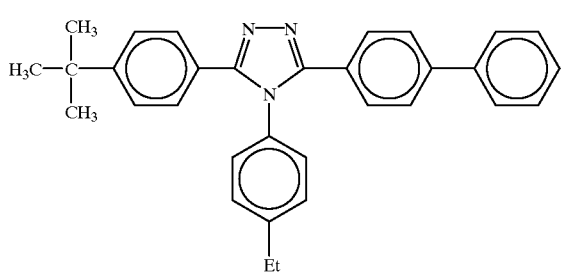
(1.10)

Further, quinolinol-based metal complexes as represented by the general formulae [1.4], [1.5], [1.6] can be used.

[1.4]

(wherein, Q represents a substituted or unsubstituted hydroxyquinoline derivative, or a substituted or unsubstituted benzoquinoline derivative; M represents a metal atom; and n represents valency of the metal atom.)

[1.5]

(wherein, Q represents a substituted or unsubstituted hydroxyquinoline derivative, or a substituted or unsubstituted benzoquinoline derivative; L represents a halogen atom, substituted or unsubstituted alkyl group, substituted or unsubstituted cycloalkyl group, or substituted or unsubstituted aryl group which may have a nitrogen atom; M represents a metal atom; and n represents valency of the metal atom.)

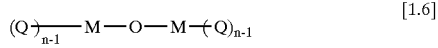
[1.6]

(wherein, Q represents a substituted or unsubstituted hydroxyquinoline derivative, or a substituted or unsubstituted benzoquinoline derivative; M represents a metal atom; and n represents valency of the metal atom.)

Specific examples expressed in the general formula [1.4] include following compounds (1.11) to (1.16).

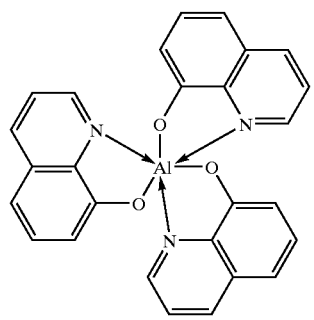
(1.11)

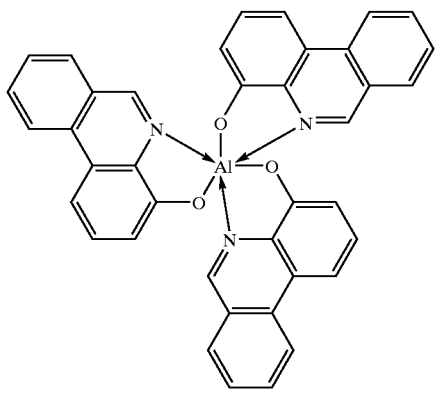
(1.12)

(1.13)
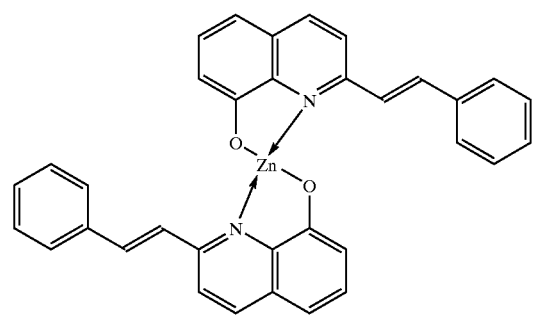
(1.14)
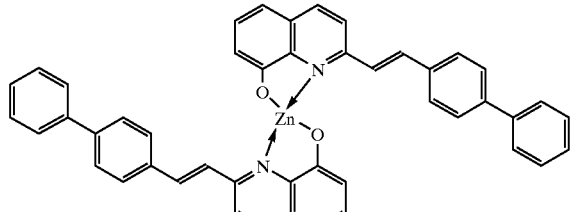
(1.15)
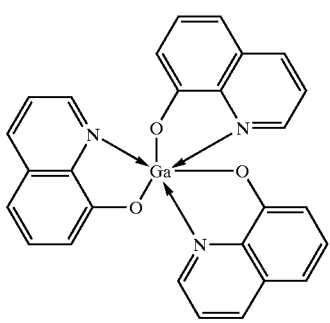
(1.16)
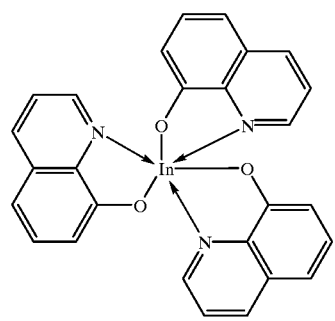
(1.18)
(1.19)
(1.20)
(1.21)
(1.22)
Specific examples expressed in the general formula [1.5] include the following compounds (1.17) to (1.22).
(1.17)
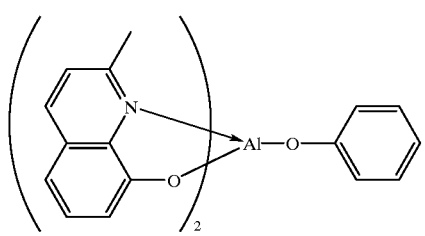
Specific examples expressed in the general formula [1.6] include the following compounds (1.23) to (1.25).
(1.23)
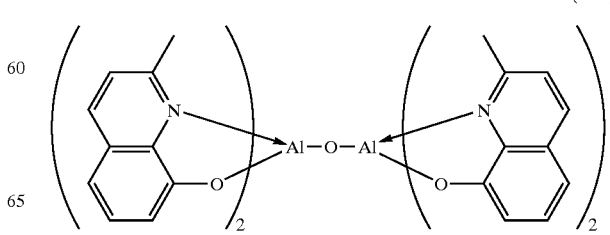

-continued (1.24)

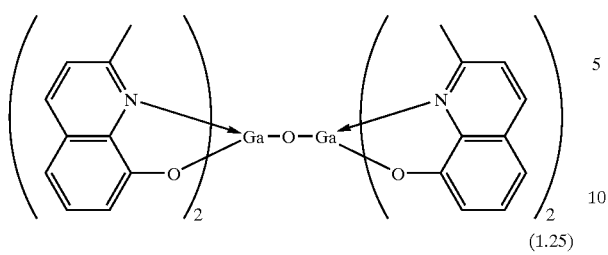

(1.25)

(1.28)

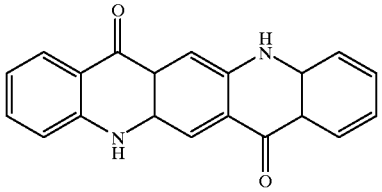

(1.29)

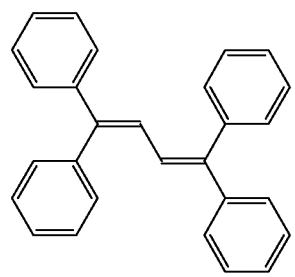

When the luminescent zone is constituted of at least two organic thin film layers, a compound expressed in the general formula [1.1.] used in the present invention can be used in a layer adjacent to an anode, and a luminescent layer can further provided between this layer and a cathode. In this case, it is also possible that compounds represented by the formulae (2.1) to (2.20) and (3.1) to (3.30) used in the present invention are combined and used in at least two layers.

Alternatively, the luminescent zone may be formed from at least two luminescent layers by inserting luminescent layers produced by mixing compounds (1.26) to (1.29) with electron transporting materials of (1.7) to (1.25), or by inserting luminescent layers made of electron transporting luminescent materials such as a compound (1.30).

(1.30)

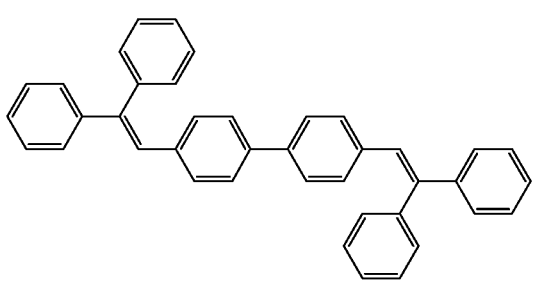

(1.26)

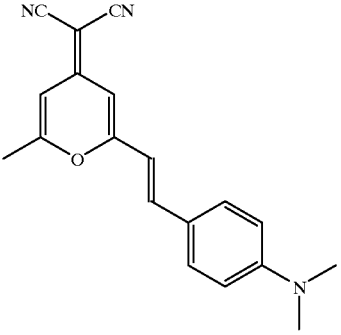

(1.27)

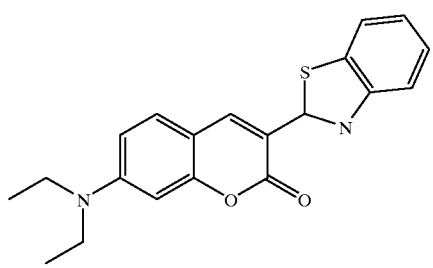

An anode in an organic thin film EL device plays a role in injecting a hole into a luminescent zone, and it is effective that the anode has a work function of 4.5 eV or more. Specific examples of the anode material for realizing such property include indium thin oxide (ITO) alloy, tin oxide (NESA), gold, silver, platinum, copper and the like.

Further, it is preferable that a cathode is made of a material having smaller work function for the purpose of injecting an electron into an electron transporting zone or a luminescent zone. The cathode material for realizing such a property is not particularly restricted, and specifically, there can be used indium, aluminum, magnesium, magnesium-indium alloy, magnesium-aluminum alloy, aluminum-lithium alloy, aluminum-scandium-lithium alloy, magnesium-silver alloy and the like.

A method for forming layers in an organic EL device of the present invention is not particularly restricted. Conventionally known formation methods such as a vacuum deposition method, a spin coating method and the like can be used. Organic thin film layers such as a luminescent layer, hole transporting layer, electron transporting layer and the like containing a compound expressed in the general formula [1.1] used in an organic EL device of the present invention can be formed by publicly-known methods such as a vacuum evaporation method, molecular beam evaporation method (MBE method), or a method for applying a solution prepared by dissolving in a solvent such as a dipping method, spin coating method, casting method, bar coat method, roll coat method and the like.

The film thickness of each organic layer constituting an organic EL device of the present invention is not particularly restricted, and usually, the thickness is preferably from several nm to 1 $\mu$m because, in general, when the film thickness is too thin, defects such as pin hole and the like tend to occur, while when too thick, higher application voltage is necessary, deteriorating the efficiency.

The following examples illustrate the present invention further in detail below, but do not limit the scope of the present invention.

Synthesis Example 2.1

Synthesis of Compound (2.2)

Sulfuric acid was poured into a solution of 1,3,5-tribromobenzene in chloroform, then, to this was added nitric acid and the mixture was heated for 5 hours at 50° C. After completion of the reaction, the organic layer was neutralized with a 5% aqueous potassium carbonate solution, then washed with water, and dried over magnesium sulfate. The solvent was removed to obtain a white solid which was re-crystallized from ethanol, to give 2,4,6-tribromonitrobenzene.

Next, 4-position thereof was methylated by reaction with methylmagnesium iodide in tetrahydrofuran in the presence of a nickel catalyst, subsequently, the product was reacted with n-butylmagneium chloride to give 2,6-di-n-butyl-4-methylnitrobenzene.

Then, the nitro group thereof was reduced by using zinc to obtain 2,6-di-n-butyl-4-methylaniline.

Then, 2,6-di-n-butyl-4-methylaniline was reacted with 4-bromo-4'-methylstilbene in the presence of copper and potassium carbonate to provide 4-methylstyryl-2'-6'-di-n-butyl-4'-methyldiphenylamine.

Then, the product was reacted with 1,4-dibromo-2,3-dimethylnaphthalene in the presence of copper and potassium carbonate to synthesize a compound (2.2).

An example in which the compound (2.2) obtained as described above is used in a luminescent layer is shown in the following Example 2.4 Further, examples in which compounds expressed in the general formula [2.1] other than the compound (2.2) are used in a luminescent layer (Examples 2.1 to 2.3, 2.5, 2.6, 2.9 to 2.11, 2.14, 2.15), examples in which a luminescent layer is produced as a mixed thin film with a hole transporting material (Examples 2.7 and 2.8), and examples in which a luminescent layer is produced as a mixed thin film with an electron transporting material (Examples 2.12 and 2.13)., are shown below.

EXAMPLE 2.1

An organic thin film EL device having a sectional structure as shown in FIG. 1 was manufactured according to the following procedure.

The device is constituted of anode/luminescent layer/cathode. On a glass substrate, a film of ITO was so made by sputtering of ITO that the sheet resistance was 20 $\Omega/\square$ and used as an anode. On this, a 40 nm layer of a compound (2.7) was formed by a vacuum evaporation method, as a luminescent layer. Next, a magnesium-silver alloy was subjected to a vacuum evaporation method to form thereon a 200 nm layer as a cathode, giving an organic EL device. When a direct voltage of 5V was applied on this device, red luminescence of 200 cd/m$^2$ was obtained. The maximum luminous efficiency was 0.5 lm/W.

EXAMPLE 2.2

An organic EL device was manufactured by the same operation as in Example 2.1 except that a compound (2.9) was used as a luminescent material. When a direct voltage of 5V was applied on this device, red luminescence of 210 cd/m$^2$ was obtained. The maximum luminous efficiency was 0.6 lm/W.

EXAMPLE 2.3

On a glass substrate, a film of ITO was so made by sputtering of ITO that the sheet resistance was 20 $\Omega/\square$ and used as an anode. On this, a 40 nm luminescent layer of a compound (2.1) was formed by a spin coat method using a chloroform solution. Next, a magnesium-silver alloy was subjected to a vacuum evaporation method to form thereon a 200 nm layer as a cathode, giving an organic EL device. When a direct voltage of 5V was applied on this device, blue luminescence of 180 cd/m$^2$ was obtained. The maximum luminous efficiency was 0.5 lm/W.

EXAMPLE 2.4

A sectional structure of a device used in Example 2.4 is shown in FIG. 2. The device is constituted of anode/hole transporting layer/luminescent layer/electron transporting layer/cathode. On a glass substrate, a film of ITO was so made by sputtering of ITO that the sheet resistance was 20 $\Omega/\square$ and used as an anode. On this, a 50 nm layer of a compound (1.3) was formed by a vacuum evaporation method, as a hole transporting layer. Then, a 40 nm layer of a compound (2.2) was formed by a vacuum evaporation method, as a luminescent layer. Then, a 20 nm layer of a compound (1.9) was formed by a vacuum evaporation method, as an electron transporting layer. Then, a 200 nm layer of a magnesium-silver alloy was formed by a vacuum evaporation method, as a cathode, giving an organic EL device. When a direct voltage of 10V was applied on this device, blue luminescence of 12000 cd/m$^2$ was obtained. The maximum luminous efficiency was 4.5 lm/W.

EXAMPLE 2.5

An organic EL device was manufactured by the same operation as in Example 2.4 except that a compound (2.5) was used as a luminescent material. When a direct voltage of 10V was applied on this device, red luminescence of 10000 cd/m$^2$ was obtained. The maximum luminous efficiency was 4.8 lm/W.

EXAMPLE 2.6

An organic EL device was manufactured by the same operation as in Example 2.4 except that a compound (1.1) was used as a hole transporting layer and a compound (1.8) was used as an electron transporting layer. When a direct voltage of 10V was applied on this device, blue luminescence of 13000 cd/m$^2$ was obtained. The maximum luminous efficiency was 4.5 lm/W.

EXAMPLE 2.7

A sectional structure of a device used in Example 2.7 is shown in FIG. 4. The device is constituted of anode/luminescent layer/electron transporting layer/cathode. On a glass substrate, a film of ITO was so made by sputtering of ITO that the sheet resistance was 20 $\Omega/\square$ and used as an anode. On this, a 50 nm layer was formed by co-evaporation of a compound (1.3) and a compound (2.7) at a ratio by weight of 1:10, as a luminescent layer. Then, a 50 nm layer of a compound (1.9) was formed by a vacuum evaporation method, as an electron transporting layer. Then, a 200 nm layer of a magnesium-silver alloy was formed as a cathode, giving an EL device. When a direct voltage of 10V was applied on this device, red luminescence of 5000 cd/m² was obtained. The maximum luminous efficiency was 2.5 lm/W.

EXAMPLE 2.8

An organic EL device was manufactured by the same operation as in Example 2.7 except that a compound (2.9) was used instead of a compound (2.7). When a direct voltage of 10V was applied on this device, blue luminescence of 7200 cd/m² was obtained. The maximum luminous efficiency was 2.4 lm/W.

EXAMPLE 2.9

On a glass substrate, a film of ITO was so made by sputtering of ITO that the sheet resistance was 20 Ω/□ and used as an anode. On this, a 80 nm layer of a compound (2.3) was formed by a vacuum evaporation method, as a luminescent layer, and on this, a 50 nm layer of a compound (1.8) was formed by a vacuum evaporation method, as an electron transporting layer. Next, a 200 n=layer of a magnesium-silver alloy was formed as a cathode, giving an EL device. When a direct voltage of 10V was applied on this device, blue luminescence of 8000 cd/m² was obtained. The maximum luminous efficiency was 4.2 lm/W.

EXAMPLE 2.10

An organic EL device was manufactured by the same operation as in Example 2.9 except that a compound (2.5) was used instead of a compound (2.3). When a direct voltage of 10V was applied on this device, red luminescence of 9200 cd/m² was obtained. The maximum luminous efficiency was 2.4 lm/W.

EXAMPLE 2.11

An organic EL device was manufactured by the same operation as in Example 2.9 except that a compound (2.1) was used instead of a compound (2.3) and a compound (1.9) was used as an electron transporting layer. When a direct voltage of 10V was applied on this device, blue luminescence of 9200 cd/m² was obtained. The maximum luminous efficiency was 2.8 lm/W.

EXAMPLE 2.12

A sectional structure of a device used in Example 2.12 is shown in FIG. 3. The device is constituted of anode/hole transporting layer/luminescent layer/cathode. On a glass substrate, a film of ITO was so made by sputtering of ITO that the sheet resistance was 20 Ω/□ and used as an anode. On this, a 50 nm layer of a compound (1.3) was formed by a vacuum evaporation method, as a hole transporting layer. Then, a 50 nm layer was formed by vacuum co-evaporation of a compound (1.11) and a compound (2.1) at a ratio by weight of 20:1, as a luminescent layer. Then, a 200 nm layer of a magnesium-silver alloy was formed as a cathode, giving an EL device. When a direct voltage of 10V was applied on this device, red luminescence of 5500 cd/m² was obtained. The maximum luminous efficiency was 2.2 lm/W.

EXAMPLE 2.13

An organic EL device was manufactured by the same operation as in Example 2.12 except that a 50 nm layer was formed by vacuum co-evaporation of a compound (1.11) and a compound (2.9) at a ratio by weight of 20:1, as a luminescent layer. When a direct voltage of 10V was applied on this device, red luminescence of 6000 cd/m² was obtained. The maximum luminous efficiency was 2.1 lm/W.

EXAMPLE 2.14

On a glass substrate, a film of ITO was so made by sputtering of ITO that the sheet resistance was 20 Ω/□ and used as an anode. On this, a 50 nm layer of a compound (1.3) was formed by a vacuum evaporation method, as a hole transporting layer. And, on this, a 40 nm layer of a compound (2.7) was formed by a vacuum evaporation method, as a luminous layer, then, a 200 nm layer of a magnesium-silver alloy was formed as a cathode, giving an EL device. When a direct voltage of 10V was applied on this device, red luminescence of. 4000 cd/m² was obtained. The maximum luminous efficiency was 1.3 lm/W.

EXAMPLE 2.15

An organic EL device was manufactured by the same operation as in Example 2.14 except that a compound (1.1) was used as a hole transporting layer and a compound (2.9) was used as a luminescent layer. When a direct voltage of 10V was applied on this device, red luminescence of 4100 cd/ml was obtained. The maximum luminous efficiency was 1.2 lm/W.

The organic luminescence devices obtained in Examples 2.1 to 2.15 described above were actuated continuously at an initial brilliance of 100 cd/m², to find that the half life of brilliance was 5000 hours or more in all of the devices.

Thus, it was found that according to an organic electroluminescent device of the present invention, concentration quenching is suppressed, and sufficient luminescent brilliance and EL property are realized.

Further, it was found that lowering of luminescent property and life property is suppressed, and longer life is realized.

Synthesis Example 3.1

Synthesis of Compound (3.8)

Into an argon purged Erlenmeyer flask was charged 3,3'-dimethylnaphthydine, 4-(di-p-tolylvinyl) bromobenzene, copper powder and potassium carbonate, and the mixture was stirred for 30 hours at 200° C. After completion of the reaction, the mixture was diluted with toluene and filtrated under suction to remove an inorganic salt. The organic phase was washed with water once, dried over magnesium sulfate, then, purified by separation by silica gel chromatography using a toluene-ligroin (ratio by volume, 1:2) mixed solvent, and subjected to a re-precipitation method using a toluene-ethanol mixed solvent to synthesize a yellow powder of 4,4'-bis(di-(4-(di-p-tolylvinyl)phenylamino) -3,3'-binaphthyl (3.8). The product was identified as an intended compound by confirming the presence of a molecular ion peak (m/z=1440) by mass spectrum.

An example in which the compound (3.8) obtained as described above is used in a luminescent layer is shown in the following Example 3.4.

Further, examples in which compounds expressed in the general formula (3.1] other than the compound (3.8) are used in a luminescent layer (Examples 3.1 to 3.3, 3.5, 3.6, 3.9 to 3.11, 3.14, 3.15), examples in which a luminescent layer is produced as a mixed thin film with a hole transporting material (Examples 3.7 and 3.8), and examples in which a luminescent layer is produced as a mixed thin film with an electron transporting material (Examples 3.12 and 3.13), are shown below.

EXAMPLE 3.1

An organic thin film EL device having a sectional structure as shown in FIG. 1 was manufactured according to the following procedure.

The device is constituted of anode/luminescent layer/cathode. On a glass substrate, a film of ITO was so made by sputtering of ITO that the sheet resistance was 20 Ω/□ and used as an anode. On this, a 40 nm layer of a compound (3.2) was formed by a vacuum evaporation method, as a luminescent layer. Next, a magnesium-silver alloy was subjected to a vacuum evaporation method to form thereon a 200 nm layer as a cathode, giving an organic EL device. When a direct voltage of 5V was applied on this device, blue luminescence of 200 cd/m$^2$ was obtained. The maximum luminous efficiency was 0.5 lm/W.

EXAMPLE 3.2

An organic EL device was manufactured by the same operation as in Example 3.1 except that a compound (3.6) was used as a luminescent material. When a direct voltage of 5V was applied on this device, red luminescence of 210 cd/m$^2$ was obtained. The maximum luminous efficiency was 0.6 lm/W.

EXAMPLE 3.3

On a glass substrate, a film of ITO was so made by sputtering of ITO that the sheet resistance was 20 Ω/□ and used as an anode. On this, a 40 nm luminescent layer of a compound (3.2) was formed by a spin coat method using a chloroform solution. Next, a magnesium-silver alloy was subjected to a vacuum evaporation method to form thereon a 200 nm layer as a cathode, giving an organic EL device. When a direct voltage of 5V was applied on this device, blue luminescence of 180 cd/m$^2$ was obtained. The maximum luminous efficiency was 0.5 lm/W.

EXAMPLE 3.4

A sectional structure of a device used in Example 3.4 is shown in FIG. 2. The device is constituted of anode/hole transporting layer/luminescent layer/electron transporting layer/cathode. On a glass substrate, a film of ITO was so made by sputtering of ITO that the sheet resistance was 20 Ω/□ and used as an anode. On this, a 50 nm layer of a compound (1.3) was formed by a vacuum evaporation method, as a hole transporting layer. Then, a 40 nm layer of a compound (3.8) was formed by a vacuum evaporation method, as a luminescent layer. Then, a 20 nm layer of a compound (1.9) was formed by a vacuum evaporation method, as an electron transporting layer. Then, a 200 nm layer of a magnesium-silver alloy was formed by a vacuum evaporation method, as a cathode, giving an organic EL device. When a direct voltage of 10V was applied on this device, blue luminescence of 3000 cd/m$^2$ was obtained. The maximum luminous efficiency was 4.0 lm/W.

EXAMPLE 3.5

An organic EL device was manufactured by the same operation as in Example 3.4 except that a compound (3.17) was used as a luminescent material. When a direct voltage of 10V was applied on this device, red luminescence of 10000 cd/m$^2$ was obtained. The maximum luminous efficiency was 4.8 lm/W.

EXAMPLE 3.6

An organic EL device was manufactured by the same operation as in Example 3.4 except that a compound (1.1) was used as a hole transporting layer and a compound (1.8) was used as an electron transporting layer. When a direct voltage of 10V was applied on this device, blue luminescence of 13000 cd/m$^2$ was obtained. The maximum luminous efficiency was 4.5 lm/W.

EXAMPLE 3.7

A sectional structure of a device used in Example 3.7 is shown in FIG. 4. The device is constituted of anode/luminescent layer/electron transporting layer/cathode. On a glass substrate, a film of ITO was so made by sputtering of ITO that the sheet resistance was 20 Ω/□ and used as an anode. On this, a 50 nm layer was formed by co-evaporation of a compound (1.3) and a compound (3.1) at a ratio by weight of 1:10, as a luminescent layer. Then, a 50 nm layer of a compound (1.9) was formed by a vacuum evaporation method, as an electron transporting layer.

Then, a 200 nm layer of a magnesium-silver alloy was formed as a cathode giving an EL device.

When a direct voltage of 10V was applied on this device blue luminescence of 5000 cd/m$^2$ was obtained. The maximum luminous efficiency was 2.5 lm/W.

EXAMPLE 3.8

An organic EL device was manufactured by the same operation as in Example 3.7 except that a compound (3.21) was used instead of a compound (3.1). When a direct voltage of 10V was applied on this device, red luminescence of 7200 cd/m$^2$ was obtained. The maximum luminous efficiency was 2.4 lm/W.

EXAMPLE 3.9

On a glass substrate, a film of ITO was so made by sputtering of ITO that the sheet resistance was 20 Ω/□ and used as an anode. On this, a 80 nm layer of a compound (3.2) was formed by a vacuum evaporation method, as a luminescent layer, and on this, a 50 nm layer of a compound (1.8) was formed by a vacuum evaporation method, as an electron transporting layer. Next, a 200 nm layer of a magnesium-silver alloy was formed as a cathode, giving an EL device. When a direct voltage of 10V was applied on this device, blue luminescence of 8000 cd/m$^2$ was obtained. The maximum luminous efficiency was 4.2 lm/W.

EXAMPLE 3.10

An organic EL device was manufactured by the same operation as in Example 3.9 except that a compound (3.18) was used instead of a compound (3.2). When a direct voltage of 10V was applied on this device, red luminescence of 9200 cd/m$^2$ was obtained. The maximum luminous efficiency was 2.4 lm/W.

EXAMPLE 3.11

An organic EL device was manufactured by the same operation as in Example 3.9 except that a compound (3.23) was used instead of a compound (3.2) and a compound (1.9) was used as an electron transporting layer. When a direct voltage of 10V was applied on this device, red luminescence of 9200 cd/m$^2$ was obtained. The maximum luminous efficiency was 2.8 lm/W.

EXAMPLE 3.12

A sectional structure of a device used in Example 3.12 is shown in FIG. 3. The device is constituted of anode/hole transporting layer/luminescent layer/cathode. On a glass substrate, a film of ITO was so made by sputtering of ITO that the sheet resistance was 20 Ω/□ and used as an anode.

On this, a 50 nm layer of a compound (1.3) was formed by a vacuum evaporation method, as a hole transporting layer. Then, a 50 nm layer was formed by vacuum co-evaporation of a compound (1.11) and a compound (3.2) at a ratio by weight of 20:1, as a luminescent layer. Then, a 200 nm layer of a magnesium-silver alloy was formed as a cathode, giving an EL device. When a direct voltage of 10V was applied on this device, blue luminescence of 5500 cd/m² was obtained. The maximum luminous efficiency was 2.2 lm/W.

EXAMPLE 3.13

An organic EL device was manufactured by the same operation as in Example 3.12 except that a 50 nm layer was formed by vacuum co-evaporation of a compound (1.11) and a compound (3.14) at a ratio by weight of 20:1, as a luminescent layer. When a direct voltage of 10V was applied on this device, blue luminescence of 6000 cd/m² was obtained. The maximum luminous efficiency was 2.1 lm/W.

EXAMPLE 3.14

On a glass substrate, a film of ITO was so made by sputtering of ITO that the sheet resistance was 20 Ω/□ and used as an anode. On this, a 50 nm layer of a compound (1.3) was formed by a vacuum evaporation method, as a hole transporting layer. And, on this, a 40 nm layer of a compound (3.2) was formed by a vacuum evaporation method, as a luminous layer, then, a 200 nm layer of a magnesium-silver alloy was formed as a cathode, giving an EL device. When a direct voltage of 10V was applied on this device, blue luminescence of 4000 cd/m² was obtained. The maximum luminous efficiency was 1.3 lm/W.

EXAMPLE 3.15

An organic EL device was manufactured by the same operation as in Example 3.14 except that a compound (1.1) was used as a hole transporting layer and a compound (3.4) was used as a luminescent layer. When a direct voltage of 10V was applied on this device, red luminescence of 4100 cd/m² was obtained. The maximum luminous efficiency was 1.2 lm/W.

The organic luminescence devices obtained in Examples 3.1 to 3.15 described above were actuated continuously at an initial brilliance of 100 cd/m², to find that the half life of brilliance was 5000 hours or more in all of the devices.

Thus, it was found that according to an organic electroluminescent device of the present invention, El luminescence of high brilliance is realized, further, lowering of luminescent property and lowering of life property are suppressed, and longer life is realized.

What is claimed is:

1. An organic electroluminescent device comprising one or more organic thin film layer(s) placed between an anode and a cathode, at least one of said organic thin film layer(s) being a luminescent layer, wherein said luminescent layer comprises a compound represented by the following general formula [2.1]:

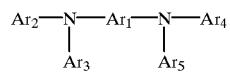

[2.1]

wherein $Ar_1$ represents a substituted or unsubstituted arylene group having 5 to 42 carbon atoms; $Ar_2$ and $Ar_4$ independently represent a group represented by the following general formula [2.2]; $Ar_3$ and $Ar_5$ independently represent an aryl group having 6 to 20 carbon atoms except for having styryl group; and $Ar_3$ and $Ar_5$ have at least one saturated hydrocarbon group having 2 or more carbon atoms in which oxygen atom(s) may be inserted, at a position ortho to a carbon atom bonded to a nitrogen atom of said general formula [2.1]; and $Ar_2$ and $Ar_3$ and/or $Ar_4$ and $Ar_5$ may mutually bond to form a ring:

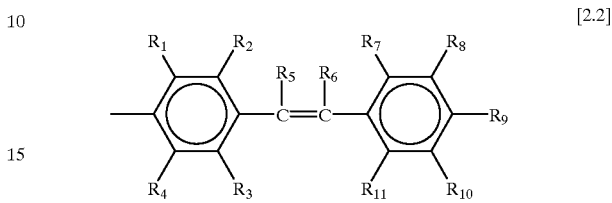

[2.2]

wherein, each of $R_1$ to $R_5$ and $R_7$ to $R_{11}$ independently represents a hydrogen atom, halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group; $R_6$ represents a halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group; and two of $R_1$ to $R_{11}$ may form a ring.

2. The organic electroluminescent device according to claim 1 wherein said luminescent layer is adjacent to said anode.

3. The organic electroluminescent device according to claim 1, wherein said at least one saturated hydrocarbon group having 2 or more carbon atoms in which oxygen atom(s) may be inserted comprises an oxygen atom.

4. An organic electroluminescent element comprising one or more organic thin film layer(s) placed between an anode and a cathode, at least one of the organic thin film layer(s) being a hole transporting layer, wherein said hole transporting layer comprises a compound represented by the following general formula [2.1]:

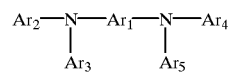

[2.1]

wherein $Ar_1$ represents a substituted or unsubstituted arylene group having 5 to 42 carbon atoms; $Ar_2$ and $Ar_4$ independently represent a group represented by the following general formula [2.2]; $Ar_3$ and $Ar_5$ independently represent an aryl group having 6 to 20 carbon atoms except for having styryl group; and $Ar_3$ and $Ar_5$ have at least one saturated hydrocarbon group having 2 or more carbon atoms in which oxygen atom(s) may be inserted, at a position ortho to a carbon atom bonded to a nitrogen atom of said general formula [2.1]; and Ar₂ and Ar₃ and/or Ar₄ and Ar₅ may mutually bond to form a ring:

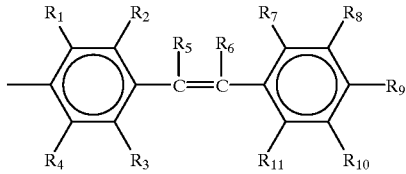

[2.2]

wherein, each of $R_1$ to $R_5$ and $R_7$ to $R_{11}$ independently represents a hydrogen atom, halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group; $R_6$ represents a halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group; and two of $R_1$ to $R_{11}$ may form a ring.

5. The organic electroluminescent device according to claim 4, wherein said at least one saturated hydrocarbon group having 2 or more carbon atoms in which oxygen atoms(s) may be inserted comprises an oxygen atom.

6. An organic electroluminescent element comprising one or more organic thin film layer(s) placed between an anode and a cathode, at least one of the organic thin film layer(s) being an electron transporting layer, wherein said electron transporting layer comprises a compound represented by the following general formula [2.1]:

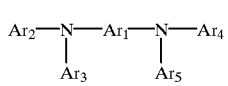

[2.1]

wherein $Ar_1$ represents a substituted or unsubstituted arylene group having 5 to 42 carbon atoms; $Ar_2$ and $Ar_4$ independently represent a group represented by the following general formula [2.2]; $Ar_3$ and $Ar_5$ independently represent an aryl group having 6 to 20 carbon atoms except for having styryl group, and $Ar_3$ and $Ar_5$ have at least one saturated hydrocarbon group having 2 or more carbon atoms in which oxygen atom(s) may be inserted, at a position ortho to a carbon atom bonded to a nitrogen atom of said general formula [2.1]; and $Ar_2$ and $Ar_3$ and/or $Ar_4$ and $Ar_5$ may mutually bond to form a ring:

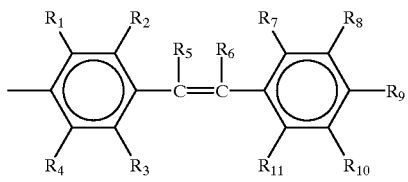

[2.2]

wherein, each of $R_1$ to $R_5$ and $R_7$ to $R_{11}$ independently represents a hydrogen atom, halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group; $R_6$ represents a halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group, and two of $R_1$ to $R_{11}$ may form a ring.

7. The organic electroluminescent device according to claim 6, wherein said at least one saturated hydrocarbon group having 2 or more carbon atoms in which oxygen atom(s) may be inserted comprises an oxygen atom.

8. An organic electroluminescent device comprising at least an anode, a luminescent zone and a cathode, the luminescent zone being formed from one or more organic thin film layer(s), wherein said luminescent zone is adjacent to the anode, and an organic thin film layer of the luminescent zone which is adjacent to the anode contains a compound represented by the following general formula [2.1]:

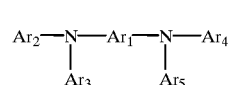

[2.1]

wherein, $Ar_1$ represents a substituted or unsubstituted arylene group having 5 to 42 carbon atoms; $Ar_2$ and $Ar_4$ independently represent a group represented by the following general formula [2.2]; $Ar_3$ and $Ar_5$ independently represent an aryl group having 6 to 20 carbon atoms except for having styryl group; and $Ar_3$ and $Ar_5$ have at least one saturated hydrocarbon group having 2 or more carbon atoms in which oxygen atom(s) may be inserted, at a position ortho to a carbon atom bonded to a nitrogen atom of said general formula [2.1] and $Ar_2$ and $Ar_3$ and/or $Ar_4$ and $Ar_5$ may mutually bond to form a ring:

[2.2]

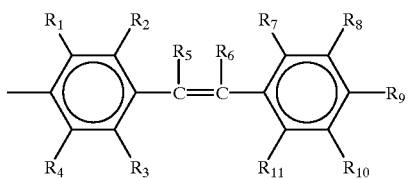

wherein each of $R_1$ to $R_5$ and $R_7$ to $R_{11}$ independently represents a hydrogen atom, halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, or carboxyl group; $R_6$ represents a halogen atom, hydroxy group, substituted or unsubstituted amino group, cyano group, nitro group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group or carboxyl group; and two of $R_1$ to $R_{11}$ may form a ring.

9. The organic electroluminescent device according to claim 8, wherein said at least one saturated hydrocarbon group having 2 or more carbon atoms in which oxygen atom(s) may be inserted comprises an oxygen atom.

* * * * *